US010252938B2

(12) United States Patent
Sawai et al.

(10) Patent No.: US 10,252,938 B2
(45) Date of Patent: Apr. 9, 2019

(54) GLASS COMPOSITION, GLASS FRIT CONTAINING SAME, GLASS PASTE CONTAINING SAME, AND ELECTRICAL/ELECTRONIC COMPONENT OBTAINED USING SAME

(75) Inventors: Yuichi Sawai, Tokyo (JP); Takashi Naito, Tokyo (JP); Takuya Aoyagi, Tokyo (JP); Tadashi Fujieda, Tokyo (JP)

(73) Assignee: HITACHI, LTD., Tokyo (JP)

( * ) Notice: Subject to any disclaimer, the term of this patent is extended or adjusted under 35 U.S.C. 154(b) by 871 days.

(21) Appl. No.: 14/129,483

(22) PCT Filed: Jun. 25, 2012

(86) PCT No.: PCT/JP2012/066161
§ 371 (c)(1),
(2), (4) Date: Dec. 26, 2013

(87) PCT Pub. No.: WO2013/005600
PCT Pub. Date: Jan. 10, 2013

(65) Prior Publication Data
US 2014/0145122 A1 May 29, 2014

(30) Foreign Application Priority Data

Jul. 4, 2011 (JP) .................................. 2011-147950
Sep. 29, 2011 (JP) .................................. 2011-213739

(51) Int. Cl.
*C03C 8/14* (2006.01)
*C03C 8/24* (2006.01)
(Continued)

(52) U.S. Cl.
CPC ................ *C03C 8/20* (2013.01); *C03C 3/122* (2013.01); *C03C 3/16* (2013.01); *C03C 8/02* (2013.01);
(Continued)

(58) Field of Classification Search
None
See application file for complete search history.

(56) References Cited

U.S. PATENT DOCUMENTS

| 3,798,114 A | 3/1974 | Chvatal et al. |
| 4,945,071 A | 7/1990 | Friesen et al. |

(Continued)

FOREIGN PATENT DOCUMENTS

| DE | 4128804 A1 * | 3/1993 | ............. C03C 3/122 |
| JP | 51-138711 | 11/1976 | |

(Continued)

OTHER PUBLICATIONS

English text machine translation of Starz et al. (DE 4128804 A1), accessed from the EPO website and translated by Google, pp. 1-4.*

(Continued)

*Primary Examiner* — Katie L Hammer
(74) *Attorney, Agent, or Firm* — Foley & Lardner LLP

(57) ABSTRACT

The present invention aims at providing a lead-free glass composition that can be soften and flowed at a firing temperature that is equal to or lower than that of conventional low melting point lead glass. Furthermore, the present invention aims at providing a lead-free glass composition having fine thermal stability and fine chemical stability in addition to that property. The lead-free glass composition according to the present invention is characterized by comprising at least $Ag_2O$, $V_2O_5$ and $TeO_2$ when the components are represented by oxides, wherein the total content ratio of $Ag_2O$, $V_2O_5$ and $TeO_2$ is 75 mass % or more. Preferably, the lead-free glass composition comprises 10 to 60 mass % of $Ag_2O$, 5 to 65 mass % of $V_2O_5$, and 15 to 50 mass % of $TeO_2$.

14 Claims, 7 Drawing Sheets

(51) Int. Cl.
*H01B 1/16* (2006.01)
*C03C 8/20* (2006.01)
*H01J 29/90* (2006.01)
*H01J 11/48* (2012.01)
*C03C 3/12* (2006.01)
*C03C 3/16* (2006.01)
*C03C 8/02* (2006.01)
*C03C 8/08* (2006.01)
*C03C 8/16* (2006.01)

(52) U.S. Cl.
CPC ............... *C03C 8/08* (2013.01); *C03C 8/14* (2013.01); *C03C 8/16* (2013.01); *C03C 8/24* (2013.01); *H01B 1/16* (2013.01); *H01J 11/48* (2013.01); *H01J 29/90* (2013.01); *H01L 2224/16225* (2013.01); *H01L 2924/12044* (2013.01)

(56) References Cited

U.S. PATENT DOCUMENTS 5,334,558 A    8/1994   Dietz et al.

2010/0096014 A1*  4/2010  Iida .................... H01B 1/16
                                                        136/265

FOREIGN PATENT DOCUMENTS

| | | |
|---|---|---|
| JP | 61-242927 | 10/1986 |
| JP | 2-293344 | 12/1990 |
| JP | 8-502468 | 3/1996 |
| JP | 2003-192378 A | 7/2003 |
| JP | 2004-250276 A | 9/2004 |
| JP | 2006-332032 A | 12/2006 |
| JP | 2006-342044 A | 12/2006 |
| JP | 2008-251324 A | 10/2008 |
| JP | 2009-209032 A | 9/2009 |
| JP | 2010-184852 A | 8/2010 |
| JP | 2013-132756 A | 7/2013 |
| JP | 2013-133342 A | 7/2013 |
| JP | 2013-133343 A | 7/2013 |
| JP | 2013-151396 A | 8/2013 |

OTHER PUBLICATIONS

PCT International Search Report on application PCT/JP2012/066161 mailed Sep. 18, 2012; 4 pages.

* cited by examiner (a)

(b)

(c)

(d)

US 10,252,938 B2

1

GLASS COMPOSITION, GLASS FRIT CONTAINING SAME, GLASS PASTE CONTAINING SAME, AND ELECTRICAL/ELECTRONIC COMPONENT OBTAINED USING SAME

TECHNICAL FIELD

The present invention relates to a glass composition, and specifically relates to a glass composition that is soften and flowed at a firing temperature that is lower than conventional firing temperatures. Furthermore, the present invention relates to a glass frit comprising the glass composition, a glass paste comprising the glass composition, and an electrical/electronic component utilizing the glass composition.

BACKGROUND ART

In electrical/electronic components such as quartz crystal units, IC packages and image display devices (for example, plasma display panels and liquid crystal display panels), encapsulation or sealing (hereinafter collectively referred to as sealing) is conducted by applying and firing a glass frit for sealing or a glass paste for sealing. Furthermore, in many electrical/electronic components such as solar battery panels, image display devices, laminated capacitors, quartz crystal units, LEDs (light-emitting diodes) and multilayer circuit substrates, a patterned electrode and/or wiring (hereinafter referred to as an electrode/wiring) is/are formed by printing an electroconductive glass paste in which a glass powder and metal particles are mixed on a substrate and firing the electroconductive glass paste.

A glass frit for sealing is a mixture of a so-called low melting point glass composition (for example, a glass composition having a low deformation point and a low softening point) and an oxide filler material, and an electroconductive glass paste is a mixture of a low melting point glass composition, metal particles (for example, silver particles, copper particles, aluminum particles and the like), an oxide filler material, a resin binder and a solvent. A glass composition used for a glass frit for sealing or an electroconductive glass paste is soften and flowed during firing to thereby play roles in tightly attaching elements to be sealed to each other and in tightly attaching an electrode/wiring to a substrate. As a glass composition, lead glass (glass comprising lead oxide as a major component), which is soften and flowed at a low temperature and is thermally and chemically stable, was once used.

However, in the industries of electrical/electronic devices, the trends of green procurement and green designing are strong worldwide in recent years, and safer materials are desired. For example, in Europe, the directive on the restriction of the use of certain hazardous substances in electronic/electrical devices by European Union (EU) (RoHS directive) has been in force since Jul. 1, 2006. Lead (Pb) is designated as a prohibited substance of the RoHS directive, and thus there has been a problem that glass comprising PbO as a major component cannot accommodate the RoHS directive. Therefore, various glass compositions free from lead components (lead-free glass) and glass frits for sealing and electroconductive glass pastes using the glass compositions have been studied.

For example, PTL 1 (JP 2010-184852 A) discloses a low melting point glass composition comprising 45 to 65% by weight of $V_2O_5$, 10 to 20% by weight of $P_2O_5$, 10 to 25% by weight of $TeO_2$, 5 to 15% by weight of $Fe_2O_3$, and 0 to 10% by weight of $MnO_2$, ZnO, $WO_3$, $MoO_3$ and BaO in total, in terms of oxides of the components in the glass composition, and being substantially free from lead, bismuth and antimony. According to PTL 1, it is considered that a low melting point glass composition having a softening point of 380° C. or less can be provided, and that the firing temperatures of a glass frit for sealing and an electroconductive glass paste using the glass composition can be 400° C. or less.

PTL 2 (JP 2009-209032 A) discloses a glass composition comprising 33 to 45% by weight of $V_2O_5$, 22 to 30% by weight of $P_2O_5$, 5 to 15% by weight of MnO, 10 to 20% by weight of BaO, 0 to 8% by weight of $R_2O$ (wherein R is an alkali metal element), and 0 to 10% by weight of $Sb_2O_3$, $TeO_2$, ZnO, $SiO_2$, $Al_2O_3$, $Nb_2O_5$ and $La_2O_3$ in total, in terms of oxides of the components in the glass composition, and being substantially free from lead and bismuth. According to PTL 2, it is considered that a glass composition that can be softened at a highly practical low temperature (500° C. or less) without using lead and bismuth can be provided.

PTL 3 (JP 2006-342044 A) discloses a vanadium phosphate-based glass having a glass composition comprising 10 to 60% of $V_2O_5$, 5 to 40% of $P_2O_5$, 1 to 30% of $Bi_2O_3$, 0 to 40% of ZnO, 0 to 40% of $TeO_2$, 0 to 20% of $R_2O$ (wherein R is Li, Na, K, Cs) and 0 to 30% of R'O (wherein R' is Mg, Ca, Sr, Ba) represented by mol % in terms of oxides. According to PTL 3, it is considered that the vanadium phosphate-based glass shows fine fluidity at 500° C. or less and has no problems relating to the weather resistance that is inherent to phosphate glass.

PTL 4 (JP 2004-250276 A) discloses lead-free low melting point glass for sealing processing consisting of metal oxides of four components: 16 to 80% by weight of $V_2O_5$, 0 to 40% by weight of ZnO, 4 to 50% by weight of BaO and 0 to 60% by weight of $TeO_2$. According to PTL 4, it is considered that the lead-free low melting point glass shows thermal properties that are comparable to those of low melting point glass comprising lead, and an excellent sealing performance.

PTL 5 (JP 2003-192378 A) discloses lead-free low melting point glass for sealing processing comprising 20 to 80% by weight of $B_2O_3$ as a mesh-forming oxide, 0 to 60% by weight of BaO as a mesh-modifying oxide, and 0 to 60% by weight of ZnO as an intermediate oxide, and a lead-free low melting point glass for sealing processing comprising 30 to 70% by weight of $V_2O_5$ as a mesh-forming oxide, 50 to 80% by weight of BaO as a mesh-modifying oxide, and 0 to 50% by weight of ZnO as an intermediate oxide. According to PTL 5, it is considered that the lead-free low melting point glass shows excellent properties that are comparable to those of PbO—$B_2O_3$-based low melting point glass.

PTL 6 (JP 2008-251324 A) discloses an electroconductive paste comprising, as a basic constitution, an organic medium comprising a dispersing agent, and frit glass comprising vanadium, phosphorus, antimony and barium and silver particles that are added into the organic medium, wherein the frit glass has a composition consisting of $V_2O_5$: 50 to 65 mass %, $P_2O_5$: 15 to 27 mass %, $Sb_2O_3$: 5 to 25 mass % and BaO: 1 to 15 mass % in terms of oxides, the silver particles comprise flaky particles and granular particles, wherein the flaky particles have an average particle size of 2 to 5 the granular particles have an average particle size of 0.1 to 3 μm, the incorporation ratio of the flaky particles and the granular particles is 50:50 to 90:10 by mass ratio, and the frit glass is contained by 5 to 30 mass % with respect to the silver particles. According to PTL 6, it is considered that a silver-based electroconductive paste that does not contain lead, bismuth and alkali metals as frit glass and is excellent in electroconductivity can be provided.

PTL 7 (JP 2006-332032 A) discloses a thick film electroconductive composition in which an electroconductive silver powder, a zinc-containing additive and a lead-free glass frit are dispersed in an organic medium. According to PTL 7, it is considered that a preferable glass frit comprises, as the oxide components in the glass composition, 0.1 to 8% by weight of $SiO_2$, 0 to 4% by weight of $Al_2O_3$, 8 to 25% by weight of $B_2O_3$, 0 to 1% by weight of CaO, 0 to 42% by weight of ZnO, 0 to 4% by weight of $Na_2O$, 0 to 3.5% by weight of $Li_2O$, 28 to 85% by weight of $Bi_2O_3$, 0 to 3% by weight of $Ag_2O$, 0 to 4.5% by weight of $CeO_2$, 0 to 3.5% by weight of $SnO_2$ and 0 to 15% by weight of $BiF_3$.

CITATION LIST

Patent Literatures

PTL 1: JP 2010-184852 A
PTL 2: JP 2009-209032 A
PTL 3: JP 2006-342044 A
PTL 4: JP 2004-250276 A
PTL 5: JP 2003-192378 A
PTL 6: JP 2008-251324 A
PTL 7: JP 2006-332032 A

SUMMARY OF INVENTION

Technical Problem

As mentioned above, although various lead-free glass compositions and glass frits and glass pastes using the compositions were suggested, there was a problem that the firing temperatures were still higher than that of low melting point lead glass, from the viewpoint of a firing temperature that is preferable for softening and flowing. As a specific firing temperature, a glass composition that can be fired at least 350° C. or less has been strongly desired. A glass composition that can be fired more preferably at 320° C. or less, further preferably at 300° C. or less has been desired.

On the other hand, conventional lead-free glass compositions in which the deformation point and softening point of the glass had been decreased to be equal to or less than those of low melting point lead glass so as to decrease the firing temperature had problems that the thermal stability of the glass decreased and that the humidity resistance of the glass decreased. Furthermore, electroconductive glass pastes had a problem that some conventional lead-free glass compositions chemically react with metal particles during firing to thereby form an oxide coating on the surfaces of the metal particles, and thus electrodes/wirings formed have higher electrical resistance rates than those expected.

Therefore, an object of the present invention is primarily to resolve the above-mentioned problems and provide a lead-free glass composition that can be soften and flowed at a firing temperature that is equal to or lower than that in the case of low melting point lead glass. The second object is to provide a lead-free glass composition having fine thermal stability in addition to that property. A further object is to provide a lead-free glass composition having fine chemical stability in addition to those properties. Furthermore, another purpose of the present invention is to provide a glass frit comprising the lead-free glass composition, a glass paste comprising the glass composition, and an electrical/electronic component utilizing the glass composition.

Solution to Problem (I) An embodiment of the present invention provides a lead-free glass composition comprising at least $Ag_2O$, $V_2O_5$ and $TeO_2$ when the components are represented by oxides, wherein the total content ratio of $Ag_2O$, $V_2O_5$ and $TeO_2$ is 75 mass % or more. The "lead-free or does not comprise lead components" in the present invention shall allow incorporation of the prohibited substances in the above-mentioned RoHS directive (this went into effect on Jul. 1, 2006) within the ranges of the designated values or less.

(II) Another embodiment of the present invention provides a lead-free glass composition comprising 10 mass % or more and 60 mass % or less of $Ag_2O$, 5 mass % or more and 65 mass % or less of $V_2O_5$ and 15 mass % or more and 50 mass % or less of $TeO_2$ when the components are represented by oxides, wherein the total content ratio of $Ag_2O$, $V_2O_5$ and $TeO_2$ is 75 mass % or more.

The present invention can add the following improvements or modifications to the above-mentioned glass compositions (I) and (II) according to the present invention.

(i) The content ratio of $Ag_2O$ is 2.6 times or less as high as the content ratio of $V_2O_5$. In other words, the ratio of the content ratio of $Ag_2O$ to the content ratio of $V_2O_5$ "(content ratio of $Ag_2O$)/(content ratio of $V_2O_5$)" is 2.6 or less.

(ii) The sum of the content ratio of $Ag_2O$ and the content ratio of $V_2O_5$ is 40 mass % or more and 80 mass % or less.

(iii) The above-mentioned glass composition further comprises one or more kind among $P_2O_5$, BaO, $K_2O$, $WO_3$, $MoO_3$, $Fe_2O_3$, $MnO_2$, $Sb_2O_3$ and ZnO by 25 mass % or less as the component of the glass composition.

(iv) The glass frit for sealing according to the present invention comprises 50 vol % or more and 100 vol % or less of the above-mentioned glass composition, and comprises 0 vol % or more and 50 vol % or less of an oxide filler material for adjusting a heat expansion coefficient other than the oxides that constitute the above-mentioned glass composition.

(v) The glass paste for sealing according to the present invention comprises the above-mentioned glass composition, an oxide filler material for adjusting a heat expansion coefficient other than the oxides that constitute the above-mentioned glass composition, and a solvent.

(vi) The electroconductive glass paste according to the present invention comprises the above-mentioned glass composition, metal particles, and an oxide filler material for suppressing the particle growth of the metal particles other than the oxides that constitute the above-mentioned glass composition, and a solvent.

(vii) The oxide filler material is one or more kind among $SiO_2$, $ZrO_2$, $Al_2O_3$, $Nb_2O_5$, $ZrSiO_4$, $Zr_2(WO_4)(PO_4)_2$, cordierite, mullite and eucryptite.

(viii) The above-mentioned solvent is butylcarbitol acetate or α-terpineol, and nitrocellulose is further contained as a resin binder.

(ix) The above-mentioned metal particles are silver, a silver alloy, aluminum, an aluminum alloy, copper or a copper alloy.

(x) The above-mentioned metal particles have an average particle size of 0.5 μm or more and 10 μm or less, and have a spherical shape and/or a flaky shape.

(xi) The above-mentioned metal particles are a mixture of a group of particles having an average particle size of 0.5 μm or more and 3 μm or less and a group of particles having an average particle size of 5 μm or more and 10 μm or less.

(III) A still another embodiment of the present invention provides an electrical/electronic component having a sealing unit comprising a lead-free glass phase, wherein the sealing unit comprises 50 vol % or more and 100 vol % or less of the glass phase, and the glass phase comprises 10 mass % or more and 60 mass % or less of $Ag_2O$, 5 mass % or more and 65 mass % or less of $V_2O_5$ and 15 mass % or more and 50 mass % or less of $TeO_2$ when the components are represented by oxides, wherein the total content ratio of $Ag_2O$, $V_2O_5$ and $TeO_2$ is 75 mass % or more.

(IV) A still another embodiment of the present invention provides an electrical/electronic component having an electrode/wiring comprising a lead-free glass phase and metal particles, wherein the electrode/wiring comprises 5 vol % or more and 30 vol % or less of the glass phase and 70 vol % or more and 95 vol % or less of the metal particles, the metal particles are silver, a silver alloy, aluminum, an aluminum alloy, copper or a copper alloy, and the glass phase comprises 10 mass % or more and 60 mass % or less of $Ag_2O$, 5 mass % or more and 65 mass % or less of $V_2O_5$ and 15 mass % or more and 50 mass % or less of $TeO_2$ when the components are represented by oxides, wherein the total content ratio of $Ag_2O$, $V_2O_5$ and $TeO_2$ is 75 mass % or more.

The present invention can add the following improvements or modifications to the above-mentioned electrical/electronic components (III) and (IV) according to the present invention.

(xii) The above-mentioned electrode/wiring has an electrical resistance rate of lower than $10^{-5}$ Ωcm.

(xiii) The content ratio of $Ag_2O$ is 2.6 times or less as high as the content ratio of $V_2O_5$ in the above-mentioned glass phase. In other words, the ratio of the content ratio of $Ag_2O$ to the content ratio of $V_2O_5$ "(content ratio of $Ag_2O$)/(content ratio of $V_2O_5$)" is 2.6 or less in the above-mentioned glass phase.

(xiv) The sum of the content ratio of $Ag_2O$ and the content ratio of $V_2O_5$ is 40 mass % or more and 80 mass % or less in the above-mentioned glass phase.

(xv) The above-mentioned glass phase further comprises one or more kind among $P_2O_5$, BaO, $K_2O$, $WO_3$, $MoO_3$, $Fe_2O_3$, $MnO_2$, $Sb_2O_3$ and ZnO by 25 mass % or less as the component(s) of the glass composition.

(xvi) The above-mentioned electrical/electronic component is a solar battery panel, an image display device, a handheld terminal, a laminated capacitor, a quartz crystal unit, an LED, an IC package or a multilayer circuit substrate.

Advantageous Effects of Invention

According to the present invention, a lead-free glass composition that is soften and flowed at a firing temperature that is equal to or lower than that in the case of low melting point lead glass and has both fine thermal stability and fine chemical stability can be provided. Furthermore, by adding an oxide filler material, metal particles and the like to the lead-free glass composition and then mixing, a glass frit for sealing, a glass paste for sealing and an electroconductive glass paste from which the effect of the lead-free glass composition can be enjoyed can be provided. Furthermore, an electrical/electronic component in which sealing and formation of an electrode/wiring have been done at a firing temperature that is equal to or lower than that in the case of low melting point lead glass (i.e., an electrical/electronic component whose production cost has been decreased with consideration for green designing) can be provided by utilizing the lead-free glass composition.

DESCRIPTION OF EMBODIMENTS

Figure 1:
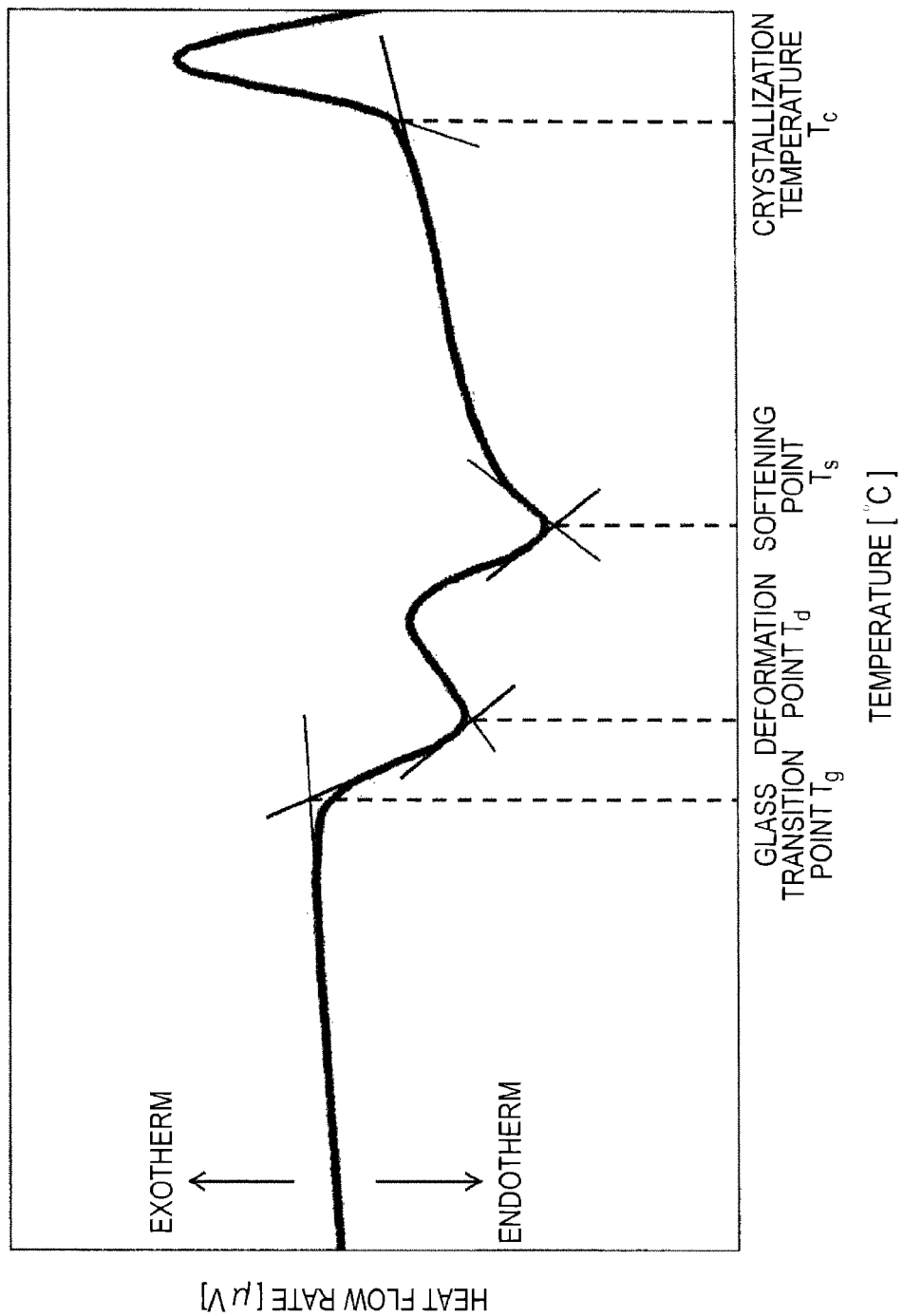
FIG. 1 is an example of a chart obtained in the temperature raising process in a differential thermal analysis (DTA) of the present invention on a typical glass composition.

The exemplary embodiments of the present invention will be explained below in detail with referring to the drawings. However, the present invention is not construed to be limited to the exemplary embodiments listed herein, and suitable combination or improvement is possible within a scope that does not deviate from the technical concept of the invention.
(Glass Composition)

Generally, when characteristic temperatures (a glass transition point, a deformation point, a softening point and the like) are shifted to lower temperatures in a lead-free glass composition, a problem of deterioration of the thermal and chemical stabilities is caused (for example, the glass is easily crystallized, the humidity resistance is deteriorated). The present inventors did intensive studies on the composition of glass, which is a glass composition being substantially free from lead, but can be soften and flowed at a firing temperature that is equal to or lower than the firing temperature in the case of low melting point lead glass (shifting of the glass softening point to a lower temperature) and has both fine thermal stability and fine chemical stability. As a result, the present inventors found that the above-mentioned demand can be satisfied in a novel glass composition, and completed the present invention.

As mentioned above, the lead-free glass composition according to the present invention is a system comprising at least $Ag_2O$ (silver(I) oxide), $V_2O_5$ (divanadium pentoxide) and $TeO_2$ (tellurium dioxide) as major components, wherein the total content ratio of $Ag_2O$, $V_2O_5$ and $TeO_2$ is 75 mass % or more. By this way, the softening point of the glass can be shifted to a lower temperature of 320° C. or less.

The $Ag_2O$ component contributes to the shifting of the softening point of the lead-free glass composition to a lower temperature. The $TeO_2$ component also contributes to the shifting of the softening point to a lower temperature. The softening point of the lead-free glass composition according to the present invention approximately corresponds to the content ratios of $Ag_2O$ and $TeO_2$. The $V_2O_5$ component suppresses the precipitation of metal Ag from the $Ag_2O$ component in the glass to thereby contribute to the improvement of the thermal stability of the glass. Furthermore, since the precipitation of metal Ag from the $Ag_2O$ component is suppressed by adding the $V_2O_5$ component, it becomes possible to increase the incorporation amount of the $Ag_2O$ component, and thus the shifting of the softening point to a lower temperature is promoted, and the chemical stability (for example, humidity resistance) of the glass is improved.

The definitions of the glass transition point, deformation point, softening point and crystallization temperature in the present invention will be explained herein. FIG. 1 is an example of a chart obtained in the temperature raising process of a differential thermal analysis (DTA) on a typical glass composition in the present invention. The DTA measurement was conducted by using α-alumina as a reference sample at a temperature raising velocity of 5° C./min in the air. The masses of the reference sample and measurement sample were each 650 mg. In the present invention, as shown in FIG. 1, the initiation temperature of the first endothermic peak is defined as glass transition point T (this corresponds to viscosity=$10^{13.3}$ poise), the peak temperature of the first endothermic peak is defined as deformation point $T_d$ (this corresponds to viscosity=$10^{11.0}$ poise), the peak temperature of the second endothermic peak is defined as softening point $T_s$ (this corresponds to viscosity=$10^{7.65}$ poise), and the initiation temperature of the first exothermic peak is defined as crystallization temperature $T_c$. In addition, the respective temperatures are temperatures obtained by the tangent method. The respective characteristic temperatures (for example, softening point $T_s$) described in the present specification are based on the above-mentioned definitions.

A more specific glass composition preferably comprises 10 to 60 mass % of $Ag_2O$, 5 to 65 mass % of $V_2O_5$ and 15 to 50 mass % of $TeO_2$ when the components are represented by oxides, wherein the total content ratio of $Ag_2O$, $V_2O_5$ and $TeO_2$ is 75 mass % or more. By this way, the softening point of the lead-free glass composition (the peak temperature of the second endothermic peak in the temperature raising process in DTA) can be shifted to a lower temperature of 320° C. or less, and sufficient thermal stability can be ensured.

The firing temperature when sealing or formation of an electrode/wiring is conducted without pressurization by using a glass frit or glass paste utilizing a glass composition is generally preset to be about 30 to 50° C. higher than the softening point $T_s$ of the glass composition. It is desirable that the glass composition is not crystallized during this firing. In other words, in order to soundly conduct sealing or formation of an electrode/wiring, as an index of the thermal stability of the glass composition, it can be said that the temperature difference between the softening point $T_s$ and crystallization temperature T, is desirably about 50° C. or more. In addition, the firing temperature in the case when sealing is conducted under a pressurized environment may be approximately similar to the softening point $T_s$.

The content ratio of $Ag_2O$ is more preferably 2.6 times or less as high as the content ratio of $V_2O_5$. By this way, finer humidity resistance (sufficient humidity resistance in practical use) than that of conventional low melting point lead-free glass can be ensured. When the content ratio of $Ag_2O$ is higher than 2.6 times of the content ratio of $V_2O_5$, the effect of shifting of the softening point $T_s$ of the glass to a lower temperature by the $Ag_2O$ component is decreased, and the glass is easily crystallized.

In addition, it is further preferable that the sum of the content ratio of $Ag_2O$ and the content ratio of $V_2O_5$ is mass % or more and 80 mass % or less. By this way, further higher humidity resistance can be obtained. The details will be mentioned below.

Furthermore, the glass composition according to the present invention may contain, in addition to the above-mentioned composition, one or more kind among $P_2O_5$ (diphosphorus pentoxide), BaO (barium oxide), $K_2O$ (potassium oxide), $WO_3$ (tungsten trioxide), $MoO_3$ (molybdenum trioxide), $Fe_2O_3$ (iron(III) oxide), $MnO_2$ (manganese dioxide), $Sb_2O_3$ (antimony trioxide) and ZnO (zinc oxide) by 25 mass % or less. These additional oxides contribute to the improvement of the humidity resistance and the suppression of the crystallization of the glass of the present invention.

(Glass Frit for Sealing and Glass Paste for Sealing)

The glass frit for sealing according to the present invention comprises the above-mentioned glass composition according to the present invention, and an oxide filler material other than the oxides that constitute the glass composition. The glass paste for sealing according to the present invention comprises the above-mentioned glass composition according to the present invention, an oxide filler material other than the oxides that constitute the glass composition, and a solvent. The glass paste for sealing may further comprise a resin binder. Furthermore, the incorporation ratio of the glass composition to the oxide filler material in the glass frit for sealing and in the glass paste for sealing is preferably such that the glass composition is 50 to 100 vol % and the oxide filler material is 0 to 50 vol %.

As the oxide filler material, one or more kind among $SiO_2$ (silica), $ZrO_2$ (zirconia), $Al_2O_3$ (α-alumina), $Nb_2O_5$ (niobium pentoxide), $ZrSiO_4$ (zircon), $Zr_2(WO_4)(PO_4)_2$ (zirconium phosphate tungstate, ZWP), cordierite ($2MgO.2Al_2O_3.5SiO_2$) mullite ($3Al_2O_3.2SiO_2$) and eucryptite ($LiAlSiO_4$) is/are preferably used. As the solvent, butylcarbitol acetate or α-terpineol is preferably used. As the resin binder, nitrocellulose is preferably used. On the other hand, a glass paste for sealing using α-terpineol as a solvent but not using a cellulose-based resin binder is also preferable.

In the case when sealing is conducted by using the glass frit for sealing or glass paste for sealing according to the present invention, the glass frit or glass paste is built up or applied onto a portion where an electrical/electronic component, which is an article to be sealed, is to be sealed, and fired at a temperature that is about 30 to 50° C. higher than the softening point $T_s$ of the contained glass composition (in the case without pressurization). The glass frit for sealing and glass paste for sealing according to the present invention enables the shifting the firing temperature to a lower temperature by shifting the softening point of the contained glass composition to a lower temperature, and in accordance with this, an undesired chemical reaction with the article to be sealed can be prevented. Furthermore, since excess heat loading to the electrical/electronic component, which is an article to be sealed, is also decreased, the glass frit for sealing or glass paste for sealing can contribute to the maintenance of the quality of the electrical/electronic component.

(Electroconductive Glass Paste)

The electroconductive glass paste according to the present invention comprises the above-mentioned glass composition according to the present invention, metal particles, an oxide filler material other than the oxides that constitute the glass composition, and a solvent. The electroconductive glass paste may further comprise a resin binder. Furthermore, the incorporation ratio of the solid contents (the glass composition, metal particles and oxide filler material) in the electroconductive glass paste is preferably such that the glass composition is 5 to 30 vol %, the metal particles are 70 to 95 vol % and the oxide filler material is 0 to 20 vol %.

As the oxide filler material, one or more kind among $SiO_2$, $ZrO_2$, $Al_2O_3$, $Nb_2O_5$, $ZrSiO_4$, $Zr_2(WO_4)(PO_4)_2$, cordierite, mullite and eucryptite is/are preferably used. As the solvent, butylcarbitol acetate or α-terpineol is preferably used. As the resin binder, nitrocellulose is preferably used. On the other hand, an electroconductive glass paste using α-terpineol as a solvent but not using a cellulose-based resin binder is also preferable.

As the metal particles, silver, a silver alloy (for example, an Ag—Cu alloy), aluminum, an aluminum alloy (for example, an Al—Cu alloy, an Al—Si alloy), copper or a copper alloy (for example, a Cu—Ag alloy, a Cu—Al alloy) is preferably used. It is preferable that the metal particles have an average particle size of 0.5 to 10 μm and have a spherical shape and/or a flaky shape. Furthermore, the metal particles are preferably a mixture of a group of particles having an average particle size of 0.5 to 3 μm and a group of particles having an average particle size of 5 to 10 μm. The spherical shape in the present invention is not limited to a true sphere form, and also comprises shapes partially having a spherical curved surface such as an ellipsoidal-spherical shape and a rain drop form. The average particle size in the present invention is defined as a median diameter (D50) by the measurement by a laser diffraction/scattering particle size distribution meter.

In the case when an electrode/wiring of an electrical/electronic component is formed by using the electroconductive glass paste according to the present invention, the glass paste is printed in a predetermined pattern on a substrate of the electrical/electronic component, and fired at a temperature that is about 30 to 50° C. higher than the softening point $T_s$ of the contained glass composition (in the case without pressurization). In addition, in the case when the metal particles used are particles of a metal that is easily oxidized, it is desirable to use an inert gas as the firing atmosphere so as to prevent the oxidization of the metal particles.

The electroconductive glass paste according to the present invention enables shifting of the firing temperature to a lower temperature by shifting the softening point of the contained glass composition to a lower temperature, and in accordance with this, an undesired chemical reaction with the contained metal particles (including the oxidization of the metal particles) and an undesired chemical reaction with the substrate can be prevented. As a result, the electrode/wiring formed by using the electroconductive glass paste of the present invention can achieve a very low electrical resistance rate of lower than $10^{-5}$ Ωcm ($10^{-6}$ Ωcm order). Furthermore, since excess heat loading on the electrical/electronic component is also decreased, the electrode/wiring can contribute to the maintenance of the quality of the electrical/electronic component.

(Electrical/Electronic Component)

The electrical/electronic component according to the present invention is not specifically limited as long as it has a sealing unit sealed by the above-mentioned glass frit or glass paste according to the present invention and/or an electrode/wiring formed from the glass frit or glass paste. Preferable examples may include solar battery panels, image display devices (for example, plasma display panels, liquid crystal display panels, organic EL display panels), handheld terminals (for example, mobile phones, smartphones, tablet PCs), laminated capacitors, quartz crystal units, LEDs, IC packages and multilayer circuit substrates. In addition, the electrode/wiring in the present invention shall comprise utilization as a die bond (an alternate of an Au—Sn alloy solder and the like).

EXAMPLES

Hereinafter the present invention will be explained in detail based on specific examples. However, the present invention is not limited to the Examples picked up herein, and also comprises the variations thereof.

Example 1

In the present example, glass compositions having various compositions were prepared, and the softening points and humidity resistances of the glass compositions were examined.

(Preparation of Glass Compositions)

Glass compositions having the compositions shown in Table 1 to Table 4 mentioned below (AVT-01 to 83, PBS-01 to 04, BBZ-01 and VBZ-01) were prepared. The compositions in the tables are represented by the mass ratios of the respective components in terms of oxides. As starting raw materials, oxide powders manufactured by Kojundo Chemical Laboratory Co., Ltd. (purity 99.9%) were used. In some samples, $Ba(PO_3)_2$ (barium phosphate, manufactured by Rasa Industries, Ltd.) was used as a Ba source and a P source.

The respective starting raw material powders were mixed at the mass ratio shown in the table and put into a platinum crucible. In the case when the ratio of $Ag_2O$ in the raw material is 40 mass % or more, an alumina crucible was used. In the mixing, the raw material powders were mixed in the crucible by using a metal spoon with consideration for avoiding excess moisture absorption of the raw material powder.

The crucible containing the mixed raw material powders was installed in a glass melting furnace and heat-melted. The temperature was raised at a temperature raising velocity of 10° C./min, and the melted glass was retained under stirring at a preset temperature (700 to 900° C.) for 1 hour. The crucible was then removed from the glass melting furnace, and the glass was casted in a graphite mold that had been heated to 150° C. in advance. The casted glass was then transferred to a stress relief furnace that had been heated to a stress relief temperature in advance, distortion was removed by retaining for 1 hour, and the glass was cooled to room temperature at a velocity of 1° C./min. The glass that had been cooled to room temperature was pulverized to thereby prepare a powder of a glass composition having the composition shown in the table.

TABLE 1

| | Nominal components of glass composition (Part 1) | | | | | | | |
|---|---|---|---|---|---|---|---|---|
| | Nominal components of glass composition (mass %) | | | | | | | |
| Glass composition | $Ag_2O$ | $V_2O_5$ | $TeO_2$ | $P_2O_5$ | Other (name of oxide) | $Ag_2O + V_2O_5 + TeO_2$ | $Ag_2O + V_2O_5$ | $Ag_2O/V_2O_5$ |
| AVT-01 | 20 | 40 | 25 | 15 | — | 85 | 60 | 0.50 |
| AVT-02 | 20 | 40 | 15 | 25 | — | 75 | 60 | 0.50 |
| AVT-03 | 20 | 30 | 40 | 10 | — | 90 | 50 | 0.67 |
| AVT-04 | 20 | 30 | 25 | 25 | — | 75 | 50 | 0.67 |

TABLE 1-continued

Nominal components of glass composition (Part 1)

Nominal components of glass composition (mass %)

| Glass composition | Ag$_2$O | V$_2$O$_5$ | TeO$_2$ | P$_2$O$_5$ | Other (name of oxide) | Ag$_2$O + V$_2$O$_5$ + TeO$_2$ | Ag$_2$O + V$_2$O$_5$ | Ag$_2$O/V$_2$O$_5$ |
|---|---|---|---|---|---|---|---|---|
| AVT-05 | 25 | 30 | 20 | 25 | — | 75 | 55 | 0.83 |
| AVT-06 | 25 | 35 | 40 | 0 | — | 100 | 60 | 0.71 |
| AVT-07 | 25 | 30 | 40 | 5 | — | 95 | 55 | 0.83 |
| AVT-08 | 25 | 25 | 25 | 25 | — | 75 | 50 | 1.0 |
| AVT-09 | 30 | 25 | 20 | 25 | — | 75 | 55 | 1.2 |
| AVT-10 | 30 | 25 | 45 | 0 | — | 100 | 55 | 1.2 |
| AVT-11 | 30 | 20 | 40 | 10 | — | 90 | 50 | 1.5 |
| AVT-12 | 35 | 20 | 20 | 25 | — | 75 | 55 | 1.8 |
| AVT-13 | 35 | 15 | 25 | 25 | — | 75 | 50 | 2.3 |
| AVT-14 | 35 | 25 | 40 | 0 | — | 100 | 60 | 1.4 |
| AVT-15 | 35 | 20 | 40 | 5 | — | 95 | 55 | 1.8 |
| AVT-16 | 35 | 25 | 15 | 25 | — | 75 | 60 | 1.4 |
| AVT-17 | 40 | 20 | 15 | 25 | — | 75 | 60 | 2.0 |
| AVT-18 | 40 | 20 | 20 | 20 | — | 80 | 60 | 2.0 |
| AVT-19 | 20 | 35 | 35 | 5 | 5 (K$_2$O) | 90 | 55 | 0.57 |
| AVT-20 | 25 | 20 | 40 | 10 | 5 (K$_2$O) | 85 | 45 | 1.3 |
| AVT-21 | 25 | 25 | 35 | 5 | 10 (K$_2$O) | 85 | 50 | 1.0 |
| AVT-22 | 30 | 25 | 25 | 0 | 20 (K$_2$O) | 80 | 55 | 1.2 |
| AVT-23 | 20 | 25 | 40 | 10 | 5 (WO$_3$) | 85 | 45 | 0.80 |
| AVT-24 | 25 | 30 | 35 | 5 | 5 (MoO$_3$) | 90 | 55 | 0.83 |
| AVT-25 | 30 | 20 | 35 | 5 | 10 (WO$_3$) | 85 | 50 | 1.5 |
| AVT-26 | 20 | 25 | 35 | 10 | 10 (Fe$_2$O$_3$) | 80 | 45 | 0.80 |
| AVT-27 | 25 | 25 | 35 | 5 | 10 (MnO) | 85 | 50 | 1.0 |
| AVT-28 | 30 | 15 | 35 | 10 | 10 (ZnO) | 80 | 45 | 2.0 |
| AVT-29 | 30 | 15 | 30 | 5 | 20 (Fe$_2$O$_3$) | 75 | 45 | 2.0 |
| AVT-30 | 25 | 15 | 40 | 10 | 10 (MoO$_3$) | 80 | 40 | 1.7 |
| AVT-31 | 20 | 60 | 20 | — | — | 100 | 80 | 0.33 |
| AVT-32 | 20 | 20 | 45 | — | 15 (Fe$_2$O$_3$) | 85 | 40 | 1.0 |
| AVT-33 | 15 | 45 | 40 | 0 | — | 100 | 60 | 0.33 |
| AVT-34 | 15 | 40 | 25 | 10 | 10 (BaO) | 80 | 55 | 0.38 |
| AVT-35 | 10 | 45 | 40 | 5 | — | 95 | 50 | 0.22 |

TABLE 2

Nominal components of glass composition (Part 2)

Nominal components of glass composition (mass %)

| Glass composition | Ag$_2$O | V$_2$O$_5$ | TeO$_2$ | P$_2$O$_5$ | Other (name of oxide) | Ag$_2$O + V$_2$O$_5$ + TeO$_2$ | Ag$_2$O + V$_2$O$_5$ | Ag$_2$O/V$_2$O$_5$ |
|---|---|---|---|---|---|---|---|---|
| AVT-36 | 10 | 35 | 30 | 25 | — | 75 | 45 | 0.29 |
| AVT-37 | 10 | 35 | 40 | 15 | — | 85 | 45 | 0.29 |
| AVT-38 | 10 | 45 | 35 | 10 | — | 90 | 55 | 0.22 |
| AVT-39 | 15 | 30 | 40 | 10 | 5 (K$_2$O) | 85 | 45 | 0.50 |
| AVT-40 | 10 | 60 | 30 | — | — | 100 | 70 | 0.17 |
| AVT-41 | 15 | 55 | 30 | — | — | 100 | 70 | 0.27 |
| AVT-42 | 10 | 65 | 25 | — | — | 100 | 75 | 0.15 |
| AVT-43 | 10 | 20 | 45 | 10 | 15 (Fe$_2$O$_3$) | 75 | 30 | 0.50 |
| AVT-44 | 15 | 10 | 50 | — | 15 (WO$_3$) 15 (Fe$_2$O$_3$) | 75 | 25 | 1.5 |
| AVT-45 | 40 | 5 | 30 | 5 | 20 (ZnO) | 75 | 45 | 8.0 |
| AVT-46 | 55 | 5 | 30 | 5 | 5 (Fe$_2$O$_3$) | 90 | 60 | 11 |
| AVT-47 | 40 | 15 | 20 | 25 | — | 75 | 55 | 2.7 |
| AVT-48 | 40 | 15 | 40 | 5 | — | 95 | 55 | 2.7 |
| AVT-49 | 40 | 10 | 40 | 10 | — | 90 | 50 | 4.0 |
| AVT-50 | 45 | 10 | 40 | 5 | — | 95 | 55 | 4.5 |
| AVT-51 | 45 | 10 | 30 | 15 | — | 85 | 50 | 4.5 |
| AVT-52 | 45 | 15 | 15 | 25 | — | 75 | 60 | 3.0 |
| AVT-53 | 45 | 5 | 25 | 25 | — | 75 | 50 | 9.0 |
| AVT-54 | 50 | 5 | 45 | 0 | — | 100 | 55 | 10 |
| AVT-55 | 50 | 5 | 30 | 15 | — | 85 | 50 | 10 |
| AVT-56 | 50 | 5 | 20 | 25 | — | 75 | 55 | 10 |
| AVT-57 | 50 | 10 | 20 | 20 | — | 80 | 60 | 5.0 |
| AVT-58 | 55 | 5 | 35 | 5 | — | 95 | 60 | 11 |
| AVT-59 | 55 | 5 | 30 | 10 | — | 90 | 60 | 11 |
| AVT-60 | 55 | 5 | 15 | 25 | — | 75 | 60 | 11 |
| AVT-61 | 53 | 5 | 20 | 22 | — | 78 | 58 | 11 |
| AVT-62 | 60 | 5 | 30 | 5 | — | 95 | 65 | 12 |

TABLE 2-continued

Nominal components of glass composition (Part 2)

Nominal components of glass composition (mass %)

| Glass composition | $Ag_2O$ | $V_2O_5$ | $TeO_2$ | $P_2O_5$ | Other (name of oxide) | $Ag_2O + V_2O_5 + TeO_2$ | $Ag_2O + V_2O_5$ | $Ag_2O/V_2O_5$ |
|---|---|---|---|---|---|---|---|---|
| AVT-63 | 60 | 5 | 20 | 15 | — | 85 | 65 | 12 |
| AVT-64 | 60 | 5 | 15 | 20 | — | 80 | 55 | 12 |
| AVT-65 | 58 | 5 | 15 | 22 | — | 78 | 63 | 12 |
| AVT-66 | 35 | 5 | 35 | 5 | 20 ($K_2O$) | 75 | 40 | 7.0 |
| AVT-67 | 50 | 5 | 30 | 5 | 10 ($MoO_3$) | 85 | 55 | 10 |
| AVT-68 | 7 | 48 | 20 | 15 | 10 (BaO) | 75 | 55 | 0.15 |
| AVT-69 | 9 | 46 | 25 | 15 | 5 (BaO) | 80 | 55 | 0.20 |
| AVT-70 | 65 | 5 | 30 | 0 | — | 100 | 70 | 13 |

TABLE 3

Nominal components of glass composition (Part 3)

Nominal components of glass composition (mass %)

| Glass composition | $Ag_2O$ | $V_2O_5$ | $TeO_2$ | $P_2O_5$ | Other (name of oxide) | $Ag_2O + V_2O_5 + TeO_2$ | $Ag_2O + V_2O_5$ | $Ag_2O/V_2O_5$ |
|---|---|---|---|---|---|---|---|---|
| AVT-71 | 70 | 5 | 10 | 15 | — | 85 | 75 | 14.0 |
| AVT-72 | 70 | 0 | 20 | 10 | — | 90 | 70 | — |
| AVT-73 | 5 | 50 | 45 | 0 | — | 100 | 55 | 0.10 |
| AVT-74 | 0 | 55 | 35 | 10 | — | 90 | 55 | 0.0 |
| AVT-75 | 10 | 70 | 20 | — | — | 100 | 80 | 0.14 |
| AVT-76 | 35 | 5 | 20 | 20 | 20 ($WO_3$) | 60 | 40 | 7.0 |
| AVT-77 | 40 | 0 | 30 | 5 | 25 ($WO_3$) | 70 | 40 | — |
| AVT-78 | 30 | 15 | 20 | 15 | 20 (MnO) | 65 | 45 | 2.0 |
| AVT-79 | 65 | 0 | 0 | 35 | — | 65 | 65 | — |
| AVT-80 | 10 | 45 | 10 | 35 | — | 65 | 55 | 0.22 |
| AVT-81 | 0 | 55 | 10 | 35 | — | 65 | 55 | 0.0 |
| AVT-82 | 30 | 15 | 20 | 25 | — | 65 | 45 | 2.0 |
| AVT-83 | 5 | 50 | 0 | 45 | — | 55 | 55 | 0.10 |

TABLE 4

Nominal components of glass composition (Part 4)

| Glass composition | PbO | $Bi_2O_3$ | $V_2O_5$ | $B_2O_3$ | BaO | ZnO | $SiO_2$ | $Al_2O_3$ |
|---|---|---|---|---|---|---|---|---|
| PBS-01 | 78 | 5 | — | 11 | — | 5 | 1 | — |
| PBS-02 | 81 | 3 | — | 13 | — | 1 | 2 | — |
| PBS-03 | 80 | 3 | — | 12 | — | 3 | 2 | — |
| PBS-04 | 85 | — | — | 13 | — | — | 1 | 1 |
| BBZ-01 | — | 67 | — | 7 | 15 | 8 | — | 3 |
| VBZ-01 | — | — | 50 | — | 35 | 15 | — | — |

(Preparation of Glass Paste)

The glass composition powder prepared as above (average particle size: 3.0 μm or less), a resin binder and a solvent were mixed to prepare a glass paste. Nitrocellulose was used as the resin binder, and butylcarbitol acetate was used as the solvent. Since the glass paste in the present example aimed at evaluation of the humidity resistance, an oxide filler material other than the oxides constituting the glass composition was not mixed.

(Evaluation of Softening Point)

For each of the glass composition powders obtained above, the softening point $T_s$ was measured by a differential thermal analysis (DTA). The DTA measurement was conducted by using a reference sample (α-alumina) and the measurement sample at a mass of each 650 mg at a temperature raising velocity of 5° C./min in the air, and the peak temperature of the second endothermic peak was obtained as the softening point $T_s$ (see FIG. 1). The results are described side by side in Table 5 to Table 8.

(Evaluation of Humidity Resistance)

Using the glass paste prepared above, the glass paste was applied onto a silicon (Si) substrate by a printing process into a shape of 20 mm square. The application thickness after drying at 150° C. was about 20 μm. The dried application sample was installed into an electric furnace, and a heat treatment in the air comprising retaining at a temperature that is about 50° C. higher than the softening point of the contained glass composition for 5 minutes was conducted.

Subsequently, the following two kinds of humidity resistance tests were conducted on each sample. (A) A test comprising retaining in an environment at a temperature of 85° C. under a relative humidity of 85% for 1,000 hours (a high temperature-high humidity storage test) was conducted. (B) A test comprising retaining in an environment at a temperature of 120° C. under a relative humidity of 100% and a pressure of 202 kPa for 50 hours (a saturation type pressure cooker test: PCT) was conducted. The appearance of the sample after each humidity resistance test was visually observed to thereby evaluate the humidity resistance. The glass sample in which no change was observed on the appearance of the soften and flowed glass sample was evaluated to be "passed", and the glass sample in which a change such as devitrification, corrosion and peeling off from the substrate was observed was evaluated to be "rejected". The results are described side by side in Table 5 to Table 8.

TABLE 5

Softening point and humidity resistance of glass composition (Part 1)

| Glass composition | Softening point | Humidity resistance | |
|---|---|---|---|
| | | High temperature-high humidity storage test | PCT |
| AVT-01 | 320 | Passed | Passed |
| AVT-02 | 313 | Passed | Passed |
| AVT-03 | 287 | Passed | Passed |
| AVT-04 | 320 | Passed | Passed |
| AVT-05 | 319 | Passed | Passed |
| AVT-06 | 286 | Passed | Passed |
| AVT-07 | 275 | Passed | Passed |
| AVT-08 | 320 | Passed | Passed |
| AVT-09 | 316 | Passed | Passed |
| AVT-10 | 277 | Passed | Passed |
| AVT-11 | 281 | Passed | Passed |
| AVT-12 | 318 | Passed | Passed |
| AVT-13 | 307 | Passed | Passed |
| AVT-14 | 270 | Passed | Passed |
| AVT-15 | 275 | Passed | Passed |
| AVT-16 | 319 | Passed | Passed |
| AVT-17 | 315 | Passed | Passed |
| AVT-18 | 286 | Passed | Passed |
| AVT-19 | 295 | Passed | Passed |
| AVT-20 | 284 | Passed | Passed |
| AVT-21 | 275 | Passed | Passed |
| AVT-22 | 268 | Passed | Passed |
| AVT-23 | 305 | Passed | Passed |
| AVT-24 | 300 | Passed | Passed |
| AVT-25 | 295 | Passed | Passed |
| AVT-26 | 296 | Passed | Passed |
| AVT-27 | 301 | Passed | Passed |
| AVT-28 | 320 | Passed | Passed |
| AVT-29 | 285 | Passed | Passed |
| AVT-30 | 312 | Passed | Passed |
| AVT-31 | 320 | Passed | Passed |
| AVT-32 | 275 | Passed | Passed |
| AVT-33 | 302 | Passed | Rejected |
| AVT-34 | 320 | Passed | Rejected |
| AVT-35 | 299 | Passed | Rejected |

TABLE 6

Softening point and humidity resistance of glass composition (Part 2)

| Glass composition | Softening point (° C.) | Humidity resistance | |
|---|---|---|---|
| | | High temperature-high humidity storage test | PCT |
| AVT-36 | 320 | Passed | Rejected |
| AVT-37 | 307 | Passed | Rejected |
| AVT-38 | 314 | Passed | Rejected |
| AVT-39 | 292 | Passed | Rejected |
| AVT-40 | 319 | Passed | Rejected |
| AVT-41 | 319 | Passed | Rejected |
| AVT-42 | 320 | Passed | Rejected |
| AVT-43 | 295 | Passed | Rejected |
| AVT-44 | 315 | Passed | Rejected |
| AVT-45 | 286 | Rejected | Rejected |
| AVT-46 | 268 | Rejected | Rejected |
| AVT-47 | 310 | Rejected | Rejected |
| AVT-48 | 275 | Rejected | Rejected |
| AVT-49 | 277 | Rejected | Rejected |
| AVT-50 | 268 | Rejected | Rejected |
| AVT-51 | 272 | Rejected | Rejected |
| AVT-52 | 313 | Rejected | Rejected |
| AVT-53 | 291 | Rejected | Rejected |
| AVT-54 | 265 | Rejected | Rejected |
| AVT-55 | 274 | Rejected | Rejected |
| AVT-56 | 294 | Rejected | Rejected |
| AVT-57 | 283 | Rejected | Rejected |
| AVT-58 | 275 | Rejected | Rejected |
| AVT-59 | 280 | Rejected | Rejected |
| AVT-60 | 297 | Rejected | Rejected |
| AVT-61 | 286 | Rejected | Rejected |
| AVT-62 | 271 | Rejected | Rejected |
| AVT-63 | 270 | Rejected | Rejected |
| AVT-64 | 285 | Rejected | Rejected |
| AVT-65 | 289 | Rejected | Rejected |
| AVT-66 | 270 | Rejected | Rejected |
| AVT-67 | 268 | Rejected | Rejected |
| AVT-68 | 320 | Passed | Rejected |
| AVT-69 | 317 | Passed | Rejected |
| AVT-70 | 256 | Rejected | Rejected |

TABLE 7

Softening point and humidity resistance of glass composition (Part 3)

| Glass composition | Softening point (° C.) | Humidity resistance | |
|---|---|---|---|
| | | High temperature-high humidity storage test | PCT |
| AVT-71 | 294 | Rejected | Rejected |
| AVT-72 | 274 | Rejected | Rejected |
| AVT-73 | 307 | Rejected | Rejected |
| AVT-74 | 319 | Rejected | Rejected |
| AVT-75 | 300 | Rejected | Rejected |
| AVT-76 | 335 | Passed | Rejected |
| AVT-77 | 373 | Passed | Rejected |
| AVT-78 | 325 | Passed | Passed |
| AVT-79 | 350 | Rejected | Rejected |
| AVT-80 | 388 | Rejected | Rejected |
| AVT-81 | 404 | Rejected | Rejected |
| AVT-82 | 337 | Passed | Passed |
| AVT-83 | 425 | Rejected | Rejected |

TABLE 8

Softening point and humidity resistance of glass composition (Part 4)

| Glass composition | Softening point (° C.) | Humidity resistance | |
|---|---|---|---|
| | | High temperature-high humidity storage test | PCT |
| PBS-01 | 370 | Rejected | — |
| PBS-02 | 388 | Rejected | — |
| PBS-03 | 382 | Rejected | — |
| PBS-04 | 374 | Rejected | — |
| BBZ-01 | 392 | Rejected | — |
| VBZ-01 | 391 | Rejected | — |

As shown in Table 1 to Table 8, it was confirmed as a result of the DTA evaluation that AVT-01 to 75 according to the present invention (lead-free glass compositions comprising at least $Ag_2O$, $V_2O_5$ and $TeO_2$ when the components are represented by oxides, wherein the total content ratio of $Ag_2O$, $V_2O_5$ and $TeO_2$ is 75 mass % or more) had softening points of 320° C. or less. In addition, although an exothermic peak associated with crystallization was observed immediately after the completion of the second endothermic peak in the DTA measurement in AVT-68 to 75, it was considered that utilization in sealing under an environment with pressurization is sufficiently possible.

It was confirmed that AVT-01 to 67 (lead-free glass compositions comprising 10 to 60 mass % of $Ag_2O$, 5 to 65 mass % of $V_2O_5$ and 15 to 50 mass % of $TeO_2$ when the components are represented by oxides, wherein the total content ratio of $Ag_2O$, $V_2O_5$ and $TeO_2$ is 75 mass % or more) had softening points of 320° C. or less and had sufficient thermal stability.

Among the above-mentioned composition range, AVT-01 to 44 (lead-free glass compositions wherein the content ratio of $Ag_2O$ is 2.6 times or less as high as the content ratio of $V_2O_5$) showed fine humidity resistance in addition to the above-mentioned properties, and showed no change in the surface state even a high temperature-high humidity storage test (temperature: 85° C., relative humidity: 85%, retention for 1,000 hours) was conducted.

Furthermore, among the above-mentioned composition range, specifically, AVT-01 to 29 (lead-free glass compositions wherein the sum of the content ratio of $Ag_2O$ and the content ratio of $V_2O_5$ is 40 mass % or more and 80 mass % or less) had finer humidity resistance in addition to the above-mentioned properties, and showed no change in the surface state even a saturated pressure cooker test (temperature: 120° C., relative humidity: 100%, pressure: 202 kPa, retention for 50 hours) was conducted.

On the other hand, AVT 76 to 83, which are glass compositions being outside of the provision of the present invention, each had "a softening point of higher than 320° C.". PBS-01 to PBS-04, which are conventional low melting point lead glass compositions, each had a high softening point by the definition of the present invention of higher than 370° C., and the humidity resistance was rejected. Furthermore, BBZ-01 and VBZ-01, which are conventional lead-free glass compositions, each had a softening point by the definition of the present invention of higher than 390° C., and the humidity resistance was rejected.

Example 2

In the present example, an electroconductive glass paste was prepared by using the glass composition prepared in Example 1, and an electrode/wiring was formed by using the electroconductive glass paste, and the electrical resistance rate and adhesion to various substrates of the electrode/wiring were examined.

(Preparation of Electroconductive Glass Paste)

Each of the glass composition powders prepared in Example 1 (sample names: ATV-01 to 83, PBS-01 to 04, BBZ-01 and VBZ-01, average particle size: 3.0 μm or less), silver particles, a resin binder and a solvent were mixed to prepare an electroconductive glass paste. AGC-103 manufactured by Fukuda Metal Foil & Powder Co., Ltd. (spherical particles, average particle size: 1.4 μm) was used as the silver particles, nitrocellulose was used as the resin binder, and butylcarbitol acetate was used as the solvent. The content ratio of the glass composition powder in the electroconductive glass paste was 10 vol % with respect to the silver particles. Furthermore, the content ratio of the solid contents (silver particles, glass composition powder) in the paste was 80 to 85 mass %. Meanwhile, an oxide filler material other than the oxides constituting the glass composition was not added to the electroconductive glass paste in the present example so as to observe the adhesion to the substrates (the softening fluidity of the glass composition).

(Formation of Electrode/Wiring)

Using the electroconductive glass paste prepares as mentioned above, 10 patterns (each 1 mm×20 mm) were applied onto a silicon substrate (an Si substrate) by a printing process. The application thickness after drying at 150° C. was about 20 μm. The dried sample was installed in an electric furnace and heat-treated by retaining at 300° C., 320° C. and 350° C. for 5 minutes each in the air to thereby form an electrode/wiring. Furthermore, electrodes/wirings were respectively formed on an aluminum substrate (an Al substrate, A1050), a stainless substrate (a SUS substrate, SUS304), an alumina substrate (an $Al_2O_3$ substrate) and a polyimide substrate (a PI substrate, 80 mm×300 mm×0.085 mm, continuous usable temperature: 420° C.) by a similar process to that mentioned above.

(Evaluation of Electrical Resistance Rate)

The electrical resistance rate was measured by a four-terminal method on the electrode/wiring formed on the Si substrate. The electrode/wiring having a measured electrical resistance rate (average) of 1 to $5\times10^{-6}$ Ωcm was evaluated to be "excellent", the electrode/wiring having the rate of 5 to $10\times10^6$ Ωcm was evaluated to be "passed", the electrode/wiring having the rate of $10^{-5}$ Ωcm order was evaluated to be "general" (this means being equivalent to the prior art), and the electrode/wiring having the rate of $10^{-4}$ Ωcm order or more was evaluated as "rejected". The results are shown in Table 9 to Table 12.

(Evaluation of Adhesion)

The adhesion was evaluated by a peeling test. A peeling tape was attached to the electrode/wiring formed on each substrate, and the electrode/wiring that was not broken since it was not peeled off from the substrate when the tape was peeled off was evaluated to be "passed", and the electrode/wiring on which peeling off and/or breaking occurred was evaluated to be "rejected". The results are described side by side in Table 9 to Table 12. Meanwhile, in the tables, with respect to the passed samples, the lowest temperature at which the sample passed among the three firing temperatures (300° C., 320° C. and 350° C.) is represented, and the sample that was rejected even by firing at 350° C. is represented as "rejected".

TABLE 9

Electric resistance rate and adhesion to substrate of formed electrode/wiring (Part 1)

| Glass composition | Electric resistance rate | | | Adhesion to substrate (Si substrate, Al substrate, SUS substrate, $Al_2O_3$ substrate and PI substrate) |
|---|---|---|---|---|
| | 300° C. | 320° C. | 350° C. | |
| AVT-01 | Rejected | General | Passed | 350° C. |
| AVT-02 | Rejected | General | Excellent | 350° C. |
| AVT-03 | Excellent | Excellent | Excellent | 300° C. |
| AVT-04 | Rejected | General | Excellent | 350° C. |
| AVT-05 | Rejected | General | Excellent | 350° C. |
| AVT-06 | Excellent | Excellent | Excellent | 300° C. |
| AVT-07 | Excellent | Excellent | Passed | 300° C. |
| AVT-08 | Rejected | Rejected | Excellent | 350° C. |
| AVT-09 | Rejected | General | Passed | 350° C. |
| AVT-10 | Excellent | Excellent | Passed | 300° C. |
| AVT-11 | Excellent | Excellent | Excellent | 300° C. |
| AVT-12 | Rejected | General | Excellent | 350° C. |
| AVT-13 | Rejected | Passed | Excellent | 320° C. |
| AVT-14 | Excellent | Excellent | Excellent | 300° C. |

TABLE 9-continued

Electric resistance rate and adhesion to substrate of formed electrode/wiring (Part 1)

| Glass composition | Electric resistance rate | | | Adhesion to substrate (Si substrate, Al substrate, SUS substrate, $Al_2O_3$ substrate and PI substrate) |
|---|---|---|---|---|
| | 300° C. | 320° C. | 350° C. | |
| AVT-15 | Excellent | Excellent | Passed | 300° C. |
| AVT-16 | Rejected | Rejected | Passed | 350° C. |
| AVT-17 | Rejected | General | Excellent | 350° C. |
| AVT-18 | Excellent | Excellent | Excellent | 300° C. |
| AVT-19 | Rejected | Excellent | Excellent | 320° C. |
| AVT-20 | Excellent | Excellent | Excellent | 300° C. |
| AVT-21 | Excellent | Excellent | General | 300° C. |
| AVT-22 | Excellent | Excellent | General | 300° C. |
| AVT-23 | Rejected | Passed | Excellent | 320° C. |
| AVT-24 | Rejected | Passed | Excellent | 320° C. |
| AVT-25 | General | Excellent | Excellent | 320° C. |
| AVT-26 | General | Passed | Excellent | 320° C. |
| AVT-27 | Rejected | Passed | Excellent | 320° C. |
| AVT-28 | Rejected | Rejected | Passed | 350° C. |
| AVT-29 | Excellent | Excellent | Excellent | 300° C. |
| AVT-30 | Rejected | Passed | Passed | 320° C. |
| AVT-31 | Rejected | Rejected | Passed | 350° C. |
| AVT-32 | Excellent | Excellent | General | 300° C. |
| AVT-33 | Rejected | Excellent | Excellent | 320° C. |
| AVT-34 | Rejected | General | Excellent | 350° C. |
| AVT-35 | Rejected | Excellent | Excellent | 350° C. |

TABLE 10

Electric resistance rate and adhesion to substrate of formed electrode/wiring (Part 2)

| Glass composition | Electric resistance rate | | | Adhesion to substrate (Si substrate, Al substrate, SUS substrate, $Al_2O_3$ substrate and PI substrate) |
|---|---|---|---|---|
| | 300° C. | 320° C. | 350° C. | |
| AVT-36 | Rejected | General | Passed | 350° C. |
| AVT-37 | Rejected | Passed | Passed | 320° C. |
| AVT-38 | Rejected | General | Excellent | 350° C. |
| AVT-39 | General | Passed | Excellent | 320° C. |
| AVT-40 | Rejected | Rejected | Passed | 350° C. |
| AVT-41 | Rejected | Rejected | Passed | 350° C. |
| AVT-42 | Rejected | Rejected | General | 350° C. |
| AVT-43 | Rejected | Passed | General | 320° C. |
| AVT-44 | Rejected | General | General | 350° C. |
| AVT-45 | Excellent | Excellent | Excellent | 300° C. |
| AVT-46 | Excellent | Excellent | General | 300° C. |
| AVT-47 | Rejected | Passed | Excellent | 320° C. |
| AVT-48 | Excellent | Excellent | Passed | 300° C. |
| AVT-49 | Excellent | Excellent | Passed | 300° C. |
| AVT-50 | Excellent | Excellent | General | 300° C. |
| AVT-51 | Excellent | Excellent | Excellent | 300° C. |
| AVT-52 | Rejected | General | Excellent | 350° C. |
| AVT-53 | General | Excellent | Excellent | 320° C. |
| AVT-54 | Excellent | Excellent | General | 300° C. |
| AVT-55 | Excellent | Excellent | Excellent | 320° C. |
| AVT-56 | General | Excellent | Excellent | 300° C. |
| AVT-57 | Excellent | Excellent | Excellent | 300° C. |
| AVT-58 | Excellent | Excellent | General | 300° C. |
| AVT-59 | Excellent | Excellent | Excellent | 300° C. |
| AVT-60 | General | Excellent | Excellent | 320° C. |
| AVT-61 | Excellent | Excellent | Excellent | 300° C. |
| AVT-62 | Excellent | Excellent | General | 300° C. |
| AVT-63 | Excellent | Excellent | Passed | 300° C. |
| AVT-64 | Excellent | Excellent | Excellent | 300° C. |
| AVT-65 | Excellent | Excellent | Excellent | 300° C. |
| AVT-66 | Excellent | Excellent | General | 300° C. |
| AVT-67 | Excellent | Excellent | General | 300° C. |
| AVT-68 | Rejected | Rejected | General | Rejected |
| AVT-69 | Rejected | Rejected | General | Rejected |
| AVT-70 | Rejected | Rejected | Rejected | Rejected |

TABLE 11

Electric resistance rate and adhesion to substrate of formed electrode/wiring (Part 3)

| Glass composition | Electric resistance rate | | | Adhesion to substrate (Si substrate, Al substrate, SUS substrate, $Al_2O_3$ substrate and PI substrate) |
|---|---|---|---|---|
| | 300° C. | 320° C. | 350° C. | |
| AVT-71 | Rejected | Rejected | Rejected | Rejected |
| AVT-72 | Rejected | Rejected | Rejected | Rejected |
| AVT-73 | Rejected | Rejected | Rejected | Rejected |
| AVT-74 | Rejected | Rejected | General | Rejected |
| AVT-75 | Rejected | Rejected | Rejected | Rejected |
| AVT-76 | Rejected | Rejected | General | Rejected |
| AVT-77 | Rejected | Rejected | Rejected | Rejected |
| AVT-78 | Rejected | General | Excellent | 350° C. |
| AVT-79 | Rejected | Rejected | Rejected | Rejected |
| AVT-80 | Rejected | Rejected | Rejected | Rejected |
| AVT-81 | Rejected | Rejected | Rejected | Rejected |
| AVT-82 | Rejected | Passed | Excellent | 320° C. |
| AVT-83 | Rejected | Rejected | Rejected | Rejected |

TABLE 12

Electric resistance rate and adhesion to substrate of formed electrode/wiring (Part 4)

| Glass composition | Electric resistance rate | | | Adhesion to substrate (Si substrate, Al substrate, SUS substrate, $Al_2O_3$ substrate and PI substrate) |
|---|---|---|---|---|
| | 300° C. | 320° C. | 350° C. | |
| PBS-01 | Rejected | Rejected | Rejected | Rejected |
| PBS-02 | Rejected | Rejected | Rejected | Rejected |
| PBS-03 | Rejected | Rejected | Rejected | Rejected |
| PBS-04 | Rejected | Rejected | Rejected | Rejected |
| BBZ-01 | Rejected | Rejected | Rejected | Rejected |
| VBZ-01 | Rejected | Rejected | Rejected | Rejected |

As shown in Table 9 to Table 12, the electroconductive glass paste using the glass composition according to the present invention had a lower softening point of the glass composition than conventional softening points (soften and flowed at a lower temperature than conventional temperatures) and thus was able to form an electrode/wiring by firing at a lower temperature than conventional temperatures. Furthermore, since firing at a low temperature was possible, further suppression of an undesired chemical reaction between the glass composition and metal particles was possible, and thus the sintering of the metal particles through the liquid phase was promoted, and an electrode/wiring having a very low electrical resistance rate of lower than $10^{-5}$ Ωcm ($10^{-6}$ Ωcm order) was realized. In other words, it can be said that the glass composition according to the present invention and the glass paste using the glass composition have chemical stability during use.

The electroconductive glass pastes according to the present invention showed fine adhesion to metals (for example, aluminum and stainless steel), oxides (for example, alumina), heat-resistant resins (for example, polyimide) besides silicon as substrates on which the electrodes/wirings are formed, and thus it was verified that a wide range of substrates can be applied. Specifically, it was found that sufficient adhesion is shown at a firing temperature that is more than a few dozen ° C. as high as the softening point of the contained glass composition.

In some electroconductive glass pastes using a glass composition having a low softening point (lower than 280° C.), in the cases when the crystallization temperature of the glass composition was 350° C. or less, since the glass phase in the electrode/wiring begun to crystallize by firing at 350° C., a tendency of the adhesion and electrical resistance rate to deteriorate was observed. However, even in such cases, fine adhesion and a low electrical resistance rate were able to be obtained by firing at 300 to 320° C.

On the other hand, in the electroconductive glass pastes using the glass compositions being out of the provision of the present invention (AVT-76 to 83), conventional low melting point lead glass compositions (PBS-01 to PBS-04) and conventional lead-free glass compositions (BBZ-01, VBZ-01), the electrical resistance rate and/or adhesion to various substrates of the electrodes/wirings were rejected under conditions of firing temperatures up to 350° C. The reason therefor is considered that the softening points of the glass compositions were high or the fluidities were poor.

Although the experiment was conducted by using pure silver particles as the metal particles above, it was separately confirmed that similar results were obtained in the cases when silver alloy particles, aluminum particles, aluminum alloy particles, copper particles and copper alloy particles were used (a part of which was fired in an argon gas atmosphere).

Example 3

In the present example, a resin binder that is preferable for use in the glass paste according to the present invention was considered. Specifically, electroconductive glass pastes comprising different glass compositions and resin binders were prepared, and the effects on the electrical resistance rates of the electrode/wirings after firing were examined.
(Preparation of Electroconductive Glass Pastes)

Electroconductive glass pastes were prepared by a similar procedure to that of Example 2. As the glass composition powders (average particle size: 3.0 μm or less), AVT-17 ($T_s$ 315° C.) and AVT-18 ($T_s$=286° C.) were used, AGC-103 (spherical shape particles, average particle size: 1.4 μm) manufactured by Fukuda Metal Foil & Powder Ltd. was used as the silver particles, and butylcarbitol acetate was used as the solvent. Ethylcellulose (EC) and nitrocellulose (NC) were used as the resin binders. The content ratio of the glass composition powder in the electroconductive glass paste was 10 vol % with respect to the silver particles. Furthermore, the content ratio of the solid contents (silver particles, glass composition powder) in the paste was 80 to 85 mass %. Also in the electroconductive glass pastes used in the present example, an oxide filler material other than the oxides constituting the glass composition was not mixed.
(Formation of Electrode/Wiring)

Using the electroconductive glass paste prepared above, 10 patterns (1 mm×20 mm each) were applied onto an Si substrate by a printing process in a similar manner to Example 2. The application thickness after drying at 150° C. was about 20 μm. The dried sample was installed in an electric furnace and heat-treated at 300° C. or 350° C. in the air to thereby form an electrode/wiring. At this time, the firing retention time was variously changed.
(Evaluation of Electrical Resistance Rate)

Figure 2:
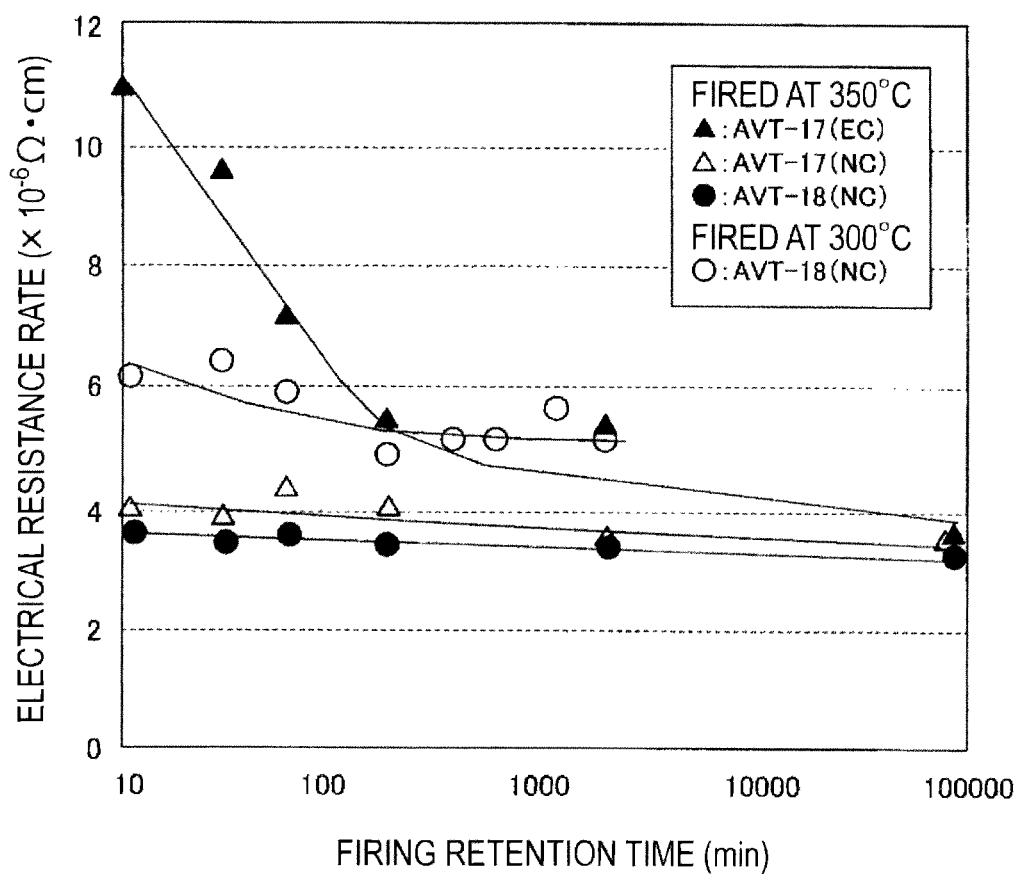
FIG. 2 is a graph showing the relationship between the electrical resistance rate and firing retention time of the formed electrode/wiring.

The average electrical resistance rate of the electrode/wiring formed on the Si substrate was measured by a four-terminal method. FIG. 2 is a graph showing the relationship of the electrical resistance rate and firing retention time of the formed electrode/wiring. As shown in FIG. 2, in the electrode/wiring formed by the electroconductive glass paste (AVT-17) using ethylcellulose (EC) as the resin binder, the electrical resistance rate decreased in accordance with the increase of the firing retention time. In other words, the electrical resistance rate is high when the firing time is short. The reason therefor was considered that the ethylcellulose was not able to be quickly decomposed by combustion at the firing temperature of the present example (350° C.), and thus a part of the ethylcellulose remained.

On the other hand, in the electrodes/wirings formed by the electroconductive glass pastes (AVT-17, AVT-18) using nitrocellulose (NC) as the resin binder, the electrical resistance rate varied little against the firing retention time at either firing temperature (350° C., 300° C.) The reason therefor was considered that the resin binder of nitrocellulose (NC) was quickly decomposed by combustion at the firing temperatures of the present example.

As mentioned above, the glass composition according to the present invention and the glass paste using the glass composition can be fired at a lower temperature than those in the past. Therefore, it is critically important to select a resin binder and a solvent that decompose by combustion at a lower temperature than those in the past as the resin binder and solvent used in the glass paste. In the present invention, although the resin binder and solvent used in the glass paste are not specifically limited, a cellulose-based binder that disappears at a temperature of about 300° C. or less (for example, nitrocellulose) and a terpene-based high viscosity solvent (for example, α-terpineol) and the like can be preferably used.

Example 4

In the present example, the size (average particle size) and shape of the metal particles in the electroconductive glass paste, and the incorporation ratio of the metal particles to the glass composition powder were considered.

Figure 3:
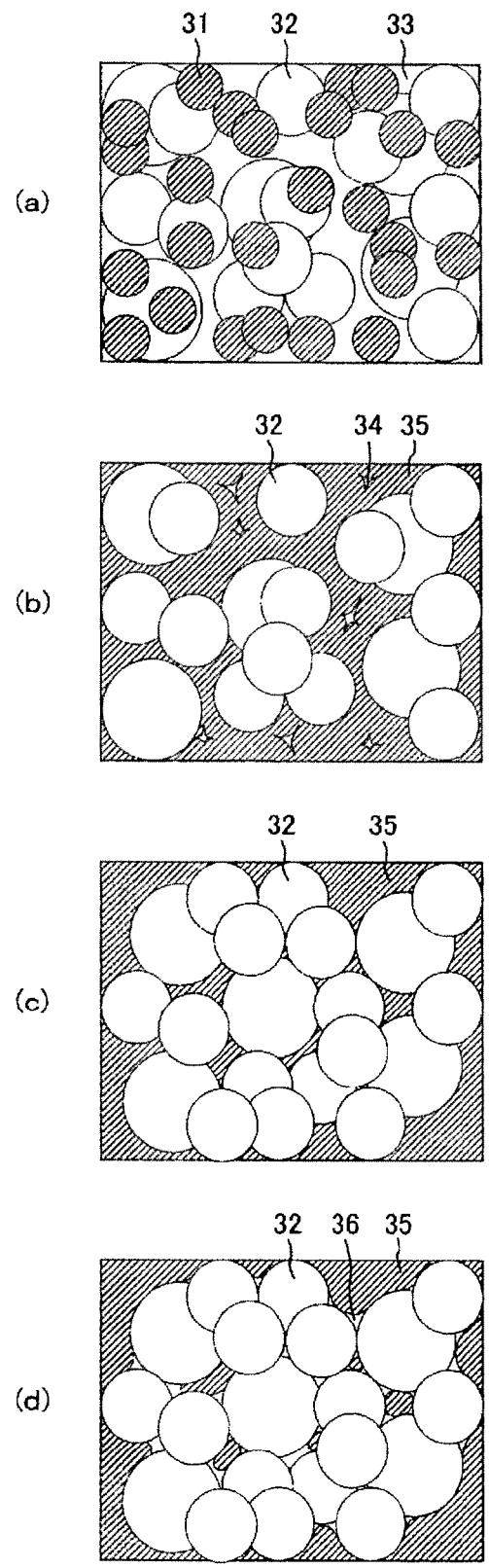
FIG. 3 is a schematic view showing the structural change in the process of firing of the electroconductive glass paste.

FIG. 3 is a schematic view showing the structural change in the firing process of the electroconductive glass paste. FIG. 3 (*a*) shows the state of the electroconductive glass paste after the application and drying. As shown in FIG. 3 (*a*), a glass composition powder 31 and metal particles 32 are homogeneously dispersed through a resin binder 33.

FIG. 3 (*b*) shows the state immediately after the softening and flowing (melting) of the glass composition powder in the temperature raising process. As shown in FIG. 3 (*b*), melted glass (liquid phase) 35 enters into airspaces formed by the combustion decomposition of the resin binder to thereby wet the metal particles 32.

FIG. 3 (c) shows the state in which the densification of the metal particles (the rearrangement of the particles) has occurred by the capillary force of the melted glass (liquid phase). At this time, the airspaces 34 existing in the gaps of the metal particles 32 gradually disappear, and this is because the phenomenon proceeds in the direction to minimize the surface energy of the system. The degree of the densification achieved by the rearrangement varies depending on the amount of the liquid phase 35 (i.e., the amount of the glass composition powder 31), the particle size and shape of the metal particles 32, and the like.

FIG. 3 (d) shows the state wherein the sintering of the metal particles has progressed. The temperature at this time is generally lower than the temperature at which the metal particles 32 are solid phase-sintered, whereas the diffusion of the metal ions of the metal particles 32 becomes easy through the intervention of the liquid phase 35, and the sintering proceeds while necks 36 are formed (liquid phase sintering).

(Size and Shape of Metal Particles)

Electroconductive glass pastes were prepared according to a similar procedure to that of Example 2 by using AVT-02 ($T_s=313°$ C.) and AVT-18 (T=286° C.) as glass composition powders. At this time, the size and shape of the silver particles were variously changed under a condition in which the incorporation ratio of the glass composition powder to the silver particles was fixed to be 10 vol %. Using the prepared electroconductive glass pastes, electrodes/wirings were formed in a similar manner to that of Example 2, and the electrical resistance rates of the electrodes/wirings were measured.

As a result, an electrode/wiring having a low electrical resistance rate (in the order of $10^{-6}$ Ωcm) was obtained in the case when the silver particles had an average particle size of 0.5 to 10 m and each had a spherical form. Furthermore, also in the case when the silver particles had an average particle size of 0.5 to 10 μm and each had a flaky shape, an electrode/wiring having a low electrical resistance rate (in the order of $10^{-6}$ Ωcm) was obtained. Furthermore, also in the case when the silver particles were a mixture of particles having an average particle size of 0.5 to 3 m and particles having an average particle size of 5 to 10 μm, an electrode/wiring having a low electrical resistance rate (in the order of $10^{-6}$ Ωcm) was similarly obtained.

(Incorporation Ratio of Metal Particles to Glass Composition Powder)

Electroconductive glass paste were prepared in a similar procedure to that of Example 2 by using AVT-02 ($T_s=313°$ C.) and AVT-18 ($T_s=286°$ C.) as glass composition powders. At this time, the incorporation ratio of the glass composition powder to the silver particles was varied within 5 to 40 vol %. The incorporation ratio of the solid contents (silver particles, glass composition powder) in the paste was 80 to 85 mass %.

Using the prepared electroconductive glass pastes, electrodes/wirings were formed in a similar manner to that of Example 2, and the electrical resistance rates of the electrodes/wirings were measured. The firing for forming the electrodes/wirings was conducted under a condition of retention at 350° C. for 5 minutes in the air.

Figure 4:
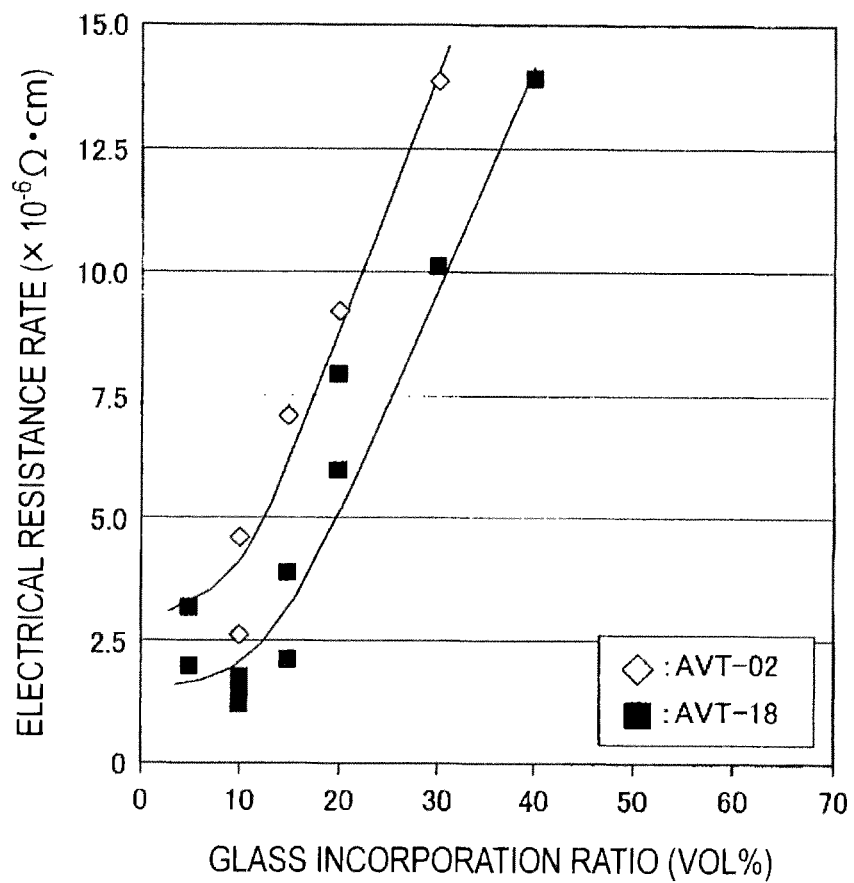
FIG. 4 is a graph showing the relationship of the electrical resistance rate of the formed electrode/wiring and the incorporation ratio of the glass composition powder.

FIG. 4 shows a graph showing the relationship between the electrical resistance rate of the formed electrode/wiring and the incorporation ratio of the glass composition powder. As shown in FIG. 4, in the range of the incorporation ratio of the glass composition powder of to 30 vol %, electrodes/wirings having electrical resistance rates in the order of $10^{-6}$ Ωcm were obtained. On the other hand, when the incorporation ratio of the glass composition powder was more than 30 vol %, the electrical resistance rate of the electrode/wiring became $10^{-5}$ Ωcm order. It can be said from this result that the incorporation ratio of the glass composition powder in the electroconductive glass paste according to the present invention is preferably in the range of 5 to 30 vol % with respect to the metal particles.

In the electrode/wiring formed by using the electroconductive glass paste, when the incorporation ratio of the glass composition that acts as a sintering aid for the metal particles is increased, the amount of the liquid phase increases and the metal particles are evenly wet; therefore, the electrode/wiring has an effect to make the diffusion of the metal ions easy to thereby promote the sintering of the metal particles. On the other hand, increase in the amount of the liquid phase decreases the number of the contact points of the metal particles, and thus has a disadvantage that the effective cross-sectional surface of the electroconductive path is decreased and the electrical resistance rate is increased. In the result of FIG. 4, when the incorporation ratio of the glass composition was lower than 10 vol %, a tendency of the electrical resistance rate of the electrode/wiring to increase was observed, and the reason therefor was considered that the amount of the liquid phase was too small and thus the sintering of the metal particles did not sufficiently proceed on some parts.

Example 5

In the present example, the case when the electronic component according to the present invention is applied to a quartz crystal unit package was considered.

Figure 5:
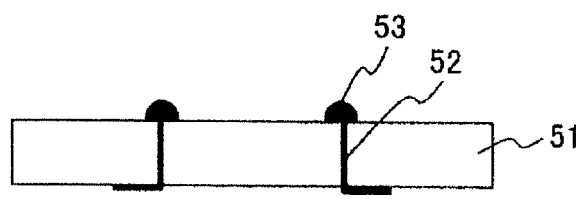
FIG. 5 is a cross-sectional schematic view showing an example of steps of preparing a quartz crystal unit package.
Figure 5:
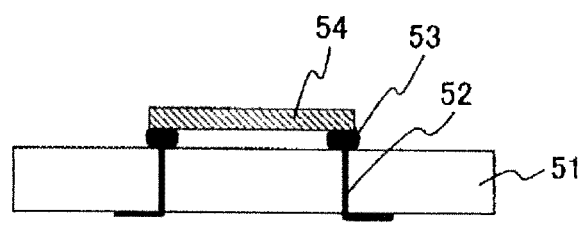
Figure 5:
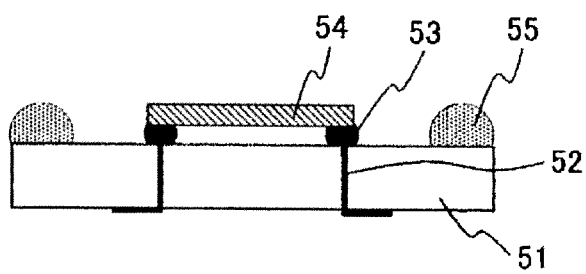
Figure 5:
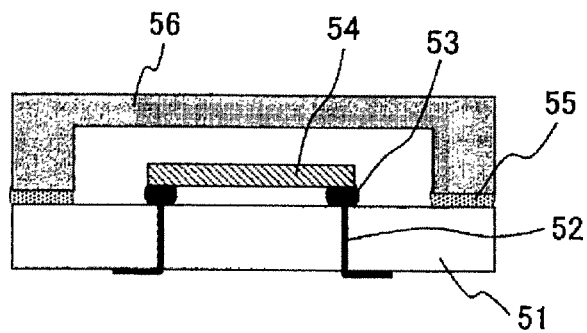

FIG. 5 is a cross-sectional schematic view showing an example of the steps for preparing a quartz crystal unit package. First, as shown in FIG. 5 (a), an electroconductive glass paste 53 is applied (printed) onto a wiring 52 formed on a substrate 51 and dried (for example, to about 150° C.). Subsequently, as shown in FIG. 5 (b), a quartz crystal unit 54 is disposed in conformity to the position on which the electroconductive glass paste 53 has been printed and connected by firing in an electric furnace or the like (for example, at the softening point+about 30 to 50° C.). Subsequently, as shown in FIG. 5 (c), a glass paste for sealing 55 is printed on the periphery of the substrate 51 and dried (for example, at about 150° C.) Subsequently, as shown in FIG. 5 (d), a cap 56 is disposed in conformity to the position where the glass paste for sealing 55 has been printed and sealed by firing in an electric furnace or the like (for example, at the softening point+about 30 to 50° C.). At this time, the cap 56 and substrate 51 may be clipped with a clip (not depicted) so as to avoid position gap. Furthermore, where necessary, the air in the cap 56 may be ejected by using a vacuum pump (not depicted) during the firing.

In the production process shown in FIG. 5, since the steps of firing to softening and flowing the glass are conducted twice, in order to avoid further softening and flowing in the subsequent firing step of the electrode/wiring formed in the first firing step, it is preferable that the glass composition used for the glass paste for sealing 55 has a lower softening point than that of the glass composition used in the electroconductive glass paste 53. More specifically, it is preferable to use a glass composition that can be fired (can be sealed) at a temperature that is equal to or less than the softening point of the glass composition used in the electroconductive glass paste 53 in the glass paste for sealing 55.

(Evaluation of Characteristic Temperatures of Glass Composition)

In the present example, in order to search a glass composition having more desirable properties (a low characteristic temperature, high thermal stability, high chemical stability) in addition to the above-mentioned Example 1, glass compositions (AVT-84 to 107) were further prepared and searched. For the prepared respective glass composition powders, the glass transition points $T_g$, deformation points $T_d$ and softening points $T_s$ were measured according to a similar process to that in Example 1 (DTA). The compositions of the glass compositions (AVT-84 to 107) are shown in Table 13, and the characteristic temperatures ($T_g$, $T_d$, $T_s$) of the glass compositions (AVT-84 to 107) are shown in 14.

TABLE 13

Nominal components of glass compositions

| Glass composition | Nominal components of glass composition (mass %) | | | | | | | |
|---|---|---|---|---|---|---|---|---|
| | $Ag_2O$ | $V_2O_5$ | $TeO_2$ | $P_2O_5$ | BaO | $WO_3$ | $Fe_2O_3$ | $Sb_2O_3$ |
| AVT-84 | 30 | 30 | 30 | 4.8 | 5.2 | — | — | — |
| AVT-85 | 30 | 30 | 30 | 5 | — | 5 | — | — |
| AVT-86 | 30 | 25 | 30 | 4.8 | 5.2 | 5 | — | — |
| AVT-87 | 30 | 25 | 30 | 7.2 | 7.8 | — | — | — |
| AVT-88 | 25 | 30 | 30 | 4.8 | 5.2 | 5 | — | — |
| AVT-89 | 30 | 25 | 30 | 4.8 | 5.2 | — | — | 5 |
| AVT-90 | 30 | 30 | 30 | 5 | — | — | 5 | — |
| AVT-91 | 30 | 25 | 30 | 10 | — | — | 5 | — |
| AVT-92 | 30 | 25 | 30 | 5 | — | 5 | 5 | — |
| AVT-93 | 30 | 25 | 30 | 5 | — | 10 | — | — |
| AVT-94 | 25 | 30 | 30 | 4.8 | 5.2 | 5 | — | — |
| AVT-95 | 35 | 20 | 30 | 4.8 | 5.2 | 5 | — | — |
| AVT-96 | 38 | 17 | 30 | 4.8 | 5.2 | 5 | — | — |
| AVT-97 | 43 | 18 | 30 | — | 5 | 5 | — | — |
| AVT-98 | 45 | 20 | 35 | — | — | — | — | — |
| AVT-99 | 43 | 17 | 40 | — | — | — | — | — |
| AVT-100 | 20 | 40 | 30 | — | — | — | — | — |
| AVT-101 | 45 | 20 | 30 | — | — | 5 | — | — |
| AVT-102 | 20 | 45 | 30 | — | — | 5 | — | — |
| AVT-103 | 25 | 40 | 35 | — | — | — | — | — |
| AVT-104 | 43 | 18 | 34 | — | — | — | — | — |
| AVT-105 | 15 | 40 | 25 | — | — | — | — | — |
| AVT-106 | 45 | 30 | 25 | — | — | — | — | — |
| AVT-107 | 50 | 25 | 25 | — | — | — | — | — |

TABLE 14

Characteristic temperatures of glass compositions and results of sealing test

| Glass composition | Characteristic temperatures | | | Sealing test | | Soundness |
|---|---|---|---|---|---|---|
| | $T_g$ | $T_d$ | $T_s$ | Sealing temperature (° C., in vacuo) | Sealing temperature (° C., in the air) | |
| AVT-84 | 222 | 246 | 277 | 300 | 320 | Passed |
| AVT-85 | 230 | 246 | 284 | 310 | 330 | Passed |
| AVT-86 | 223 | 245 | 285 | 310 | 330 | Passed |
| AVT-87 | 228 | 251 | 295 | 320 | 340 | Passed |
| AVT-88 | 236 | 262 | 295 | 320 | 340 | Passed |
| AVT-89 | 244 | 278 | 319 | 340 | 360 | Passed |
| AVT-90 | 235 | 262 | 300 | 320 | 340 | Passed |
| AVT-91 | 266 | 291 | 320 | 340 | 360 | Passed |
| AVT-92 | 249 | 272 | 315 | 340 | 360 | Passed |
| AVT-93 | 236 | 253 | 294 | 320 | 340 | Passed |
| AVT-94 | 237 | 257 | 296 | 320 | 340 | Passed |
| AVT-95 | 204 | 225 | 269 | 290 | 310 | Passed |
| AVT-96 | 197 | 214 | 260 | 280 | 300 | Passed |
| AVT-97 | 177 | 192 | 233 | 260 | 280 | Passed |
| AVT-98 | 163 | 172 | 208 | 210 | 220 | Passed |
| AVT-99 | 169 | 180 | 213 | 220 | 240 | Passed |
| AVT-100 | 218 | 233 | 266 | 300 | 310 | Passed |
| AVT-101 | 169 | 182 | 216 | 240 | 260 | Passed |
| AVT-102 | 224 | 232 | 262 | 290 | 300 | Passed |
| AVT-103 | 212 | 224 | 259 | 280 | 300 | Passed |
| AVT-104 | 167 | 183 | 221 | 240 | 260 | Passed |
| AVT-105 | 235 | 255 | 300 | 320 | 340 | Passed |
| AVT-106 | 216 | 236 | 281 | 300 | 320 | Passed |
| AVT-107 | 204 | 228 | 273 | 300 | 320 | Passed |

As shown in Table 14, in the present example, glass compositions having further lower characteristic temperatures than those of the glass composition of Example were successfully prepared. Specifically, softening points $T_s$ of 260° C. or less were obtained in AVT-96 to 99, 101, 103 and 104, and among those, a surprising result of $T_s$=208° C. was obtained for AVT-98. The results of the sealing experiments described side by side in Table 14 will be mentioned below.

(Preparation of Electroconductive Glass Paste)

Based on the above-mentioned results of the measurement of the glass characteristic temperatures, the electroconductive glass paste 53 for connecting the quartz crystal unit 54 to the wiring 52 was prepared. As the glass composition used in the electroconductive glass paste, AVT-76 ($T_s$ 335° C.), which is out of the provision of the present invention but has a softening point that is equivalent to those of conventional low melting point lead glass compositions, was selected.

A glass composition powder of AVT-76 (average particle size: 3.0 μm or less) was mixed with silver particles (Fukuda Metal Foil & Powder Industry Ltd., AGC-103), a resin binder (nitrocellulose) and a solvent (butylcarbitol acetate) in a similar procedure to that of Example 2 to form a paste. The incorporation ratio of the glass composition powder in the electroconductive glass paste was 10 vol % with respect to the silver particles, and the incorporation ratio of the solid contents (silver particles, glass composition powder) was 80 mass %.

(Preparation of Glass Paste for Sealing)

Subsequently, glass pastes for sealing 55 for sealing the cap 56 and the substrate 51 were prepared. As the glass compositions used for the glass pastes for sealing, AVT-84 to 107 were used. Each glass composition powder (average particle size: 3.0 μm or less) was mixed with a resin binder (nitrocellulose), a solvent (butylcarbitol acetate) and an oxide filler material for adjusting a heat expansion coefficient to form a paste. As the oxide filler material, niobium pentoxide ($Nb_2O_5$) and zirconium tungsten phosphate (ZWP) were mixed by 30 to 50 vol %.

(Preparation of Package for Quartz Crystal Unit)

A quartz crystal unit package was prepared along with the steps shown in FIG. 5. First, the wiring 52 formed on the substrate 51 and the quartz crystal unit 54 were connected by using the electroconductive glass paste 53. The drying condition was 150° C. in the air, and the firing condition was retention in the air at 360° C. for 5 minutes.

Subsequently, the substrate 51 to which the quartz crystal unit 54 had been connected and the cap 56 were sealed by using the glass paste for sealing 55. After drying in the air at 150° C., firing for 15 minutes was conducted in vacuum or in the air. The measure of the firing temperature was "$T_S$+about 30° C." in the case of firing in vacuum, and was "$T_S$+about 50° C." in the case of firing in the air, with referring to the softening point $T_S$ of each of the glass compositions.

(Evaluation of Soundness of Sealing Unit)

The soundness of the sealing unit of the quartz crystal unit package prepared above was evaluated by visual observation. As shown in Table 14, the glass pastes for sealing using the glass compositions of the present example were able to be sealed by firing at a temperature that is lower than conventional temperatures due to their low softening points. Furthermore, it was also confirmed that fine air tight sealing was possible in either firing condition without generation of devitrification and crystallization on the sealing unit after the firing. This means that the glass pastes had fine thermal stability. Furthermore, it was also separately confirmed that the glass compositions of the present example had fine humidity resistance (i.e., chemical stability).

Although the firing for sealing was conducted by using an electric furnace in the above-mentioned Examples, the present invention is not limited by that, and a process comprising locally heating the sealing unit by irradiating with an electromagnetic wave such as YAG laser and sapphire laser is also preferable. This utilizes the characteristic of the V ion included in the glass composition according to the present invention to finely absorb electromagnetic waves at wavelengths of 1,200 nm or less. By locally heating the sealed portion, it becomes possible to conduct glass sealing on heat-labile elements. For example, with respect to electrical/electronic components for which heating of the entirety by an electric furnace is not preferable such as organic EL diode displays (OLED Displays) and organic solar batteries, sealing can be conducted by irradiating the glass frit for sealing or glass paste for sealing that has been applied on the position to be sealed with sapphire laser (wavelength: about 800 nm). Furthermore, local heating by irradiation of an electromagnetic wave also has an advantage that the amount of the consumed energy required for the firing can be suppressed to be low.

In addition, AVT-26, 29, 32, 43 and 46 described in Example 1 and AVT-90 to 92 in the above-mentioned Example 5 contain $Fe_2O_3$ as the component thereof, and the Fe ion in this component also preferably absorbs the energy of microwaves. Therefore, those glass compositions according to the present invention can also be heated by a microwave. It is possible to melt the entirety of the glass composition in a short time to thereby effect sealing by heating with a microwave, and thus the heating can be preferably applied to the sealing of temperature-sensitive electrical/electronic components (for example, OLEDs and organic solar batteries). In addition, it is also possible to precipitate an electroconductive crystal phase in the glass phase by adjusting the output of a microwave.

Example 6

In the present example, the case when the electronic component according to the present invention is applied to a solar battery panel was considered.

Figure 6:
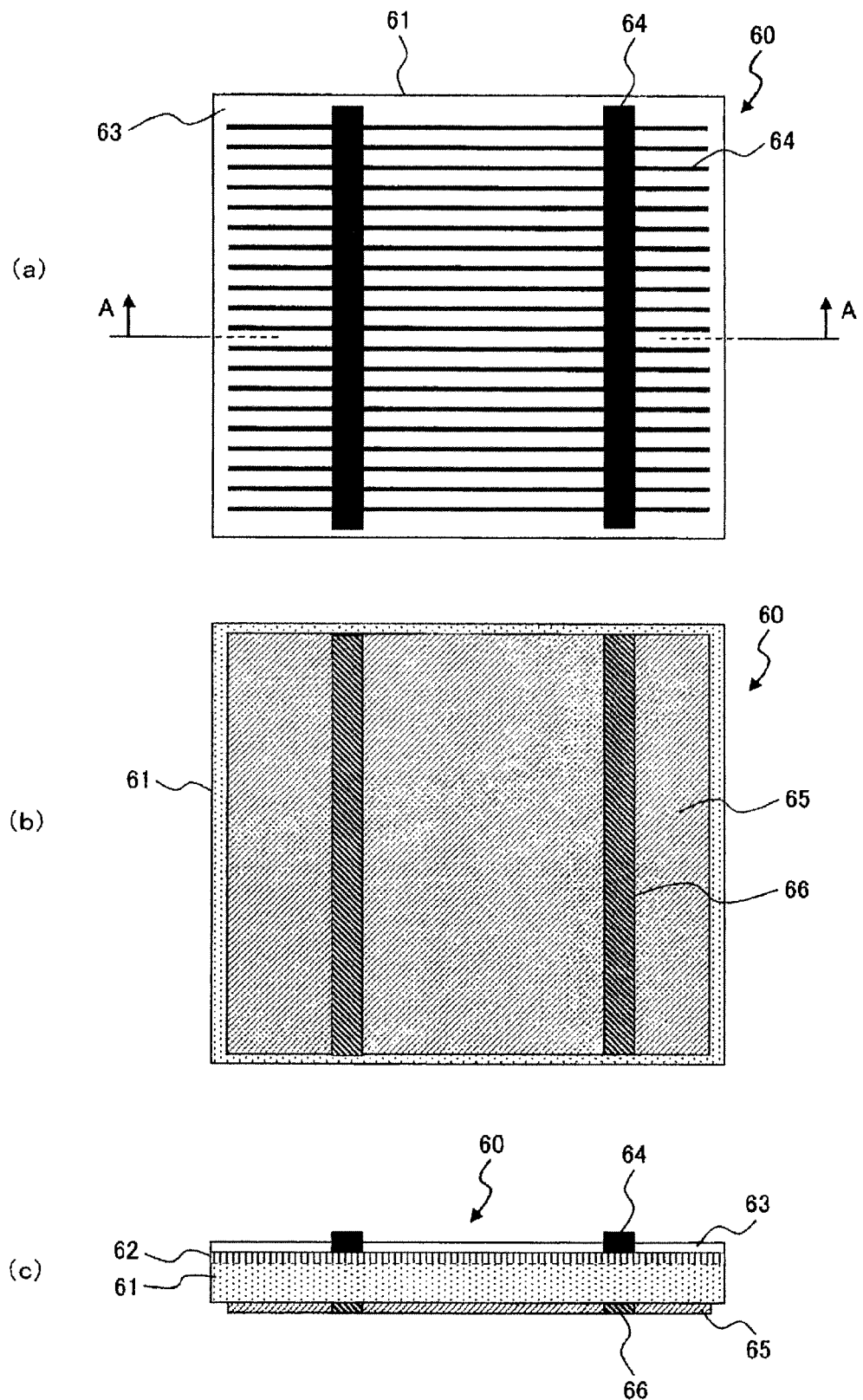
FIG. 6 is a schematic view showing an example of a solar battery panel, wherein (a) is a plane schematic view of the light-receiving surface, (b) is a plane schematic view of the rear surface, and (c) is a cross-sectional schematic view at the line A-A in (a).

FIG. 6 is a schematic view showing an example of a solar battery panel, wherein (a) is a plane schematic view of the light-receiving surface, (b) is a plane schematic view of the rear surface, and (c) is a cross-sectional schematic view at the line A-A in (a). Hereinafter an explanation will be provided with referring to FIG. 6.

As a semiconductor substrate 61 for a solar battery panel 60, a monocrystalline silicon substrate or a polycrystalline silicon substrate is most frequently used at present. The silicon semiconductor substrate 61 is generally a p-type semiconductor containing boron or the like. Concavity and convexity are formed on the side of the light-receiving surface by etching or the like so as to suppress the reflection of solar light. Furthermore, a diffusion layer 62 of an n-type semiconductor is formed on the light-receiving surface by doping of phosphorus or the like at a thickness of submicron order, and a pn junction part is formed on the interface of the diffusion layer 62 and p-type bulk part. Furthermore, an antireflective layer 63 such as silicon nitride is formed on the light-receiving surface by a deposition process or the like at a thickness of about 100 nm.

Generally, an electroconductive glass paste comprising a glass composition powder and silver particles is used for the formation of a light-receiving surface electrode/wiring 64 formed on the light-receiving surface and an output electrode/wiring 66 formed on the rear surface, and an electroconductive glass paste comprising a glass composition powder and aluminum particles is used for the formation of a power collecting electrode/wiring 65 formed on the rear surface. The respective electroconductive glass pastes are applied on the surface of the semiconductor substrate 61 by an application process (for example, screen printing, a roll coater system, a dispenser system or the like) by a screen printing process or the like.

The electroconductive glass pastes are dried and fired in the air (conventionally at about 500 to 800° C.) to thereby form the respective electrodes/wirings. At this time, since the conventional solar battery panel 60 has a high firing temperature, a problem that an alloy phase is formed on the overlapped part of the power collecting electrode/wiring 65 and output electrode/wiring 66 formed on the rear surface, and cracks generate on the semiconductor substrate 61 by the stress concentration due to the alloy phase sometimes occurred.

(Preparation of Solar Battery Panel)

The silver-containing glass paste used for the formation of the electrode/wiring was prepared in a similar manner to that of Example 2 by using AVT-01 (average particle size: 3.0 μm or less) as the glass composition powder. On the other hand, for the aluminum-containing glass paste, AVT-01 (average particle size: 3.0 μm or less) was used as the glass composition powder, aluminum particles manufactured by Kojundo Chemical Lab. Co., Ltd. (spherical particles, average particle size: 3 μm) were used as the aluminum particles, polyethylene glycol was used as the resin binder, and α-terpineol was used as the solvent. The incorporation ratio of the glass composition powder in the aluminum-containing glass paste was 10 vol % with respect to the aluminum particles. Furthermore, the incorporation ratio of the solid contents (aluminum particles, glass composition powder) in the paste was 70 mass %.

A semiconductor substrate 61 comprising a diffusion layer 62 and an antireflective layer 63 formed on the light-receiving surface was prepared. Subsequently, using the aluminum-containing glass paste prepared above, the glass paste was applied onto the rear surface of the semiconductor substrate 61 as shown in FIG. 6 (*b*) and FIG. 6 (*c*) by screen printing and dried in the air at 150° C. Subsequently, using the silver-containing glass paste prepared above, the glass paste was applied by screen printing onto the light-receiving surface of the semiconductor substrate 61 and the rear surface on which the power collecting electrode/wiring 65 had been formed above as shown in FIG. 6 (*a*) to FIG. 6 (*c*), and dried in the air at 150° C. Thereafter firing in which the printed semiconductor substrate 61 is retained in the air at 350° C. for 10 minutes was conducted. By this way, a light-receiving surface electrode/wiring 64, a power collecting electrode/wiring 65 and an output electrode/wiring 66 were formed to thereby prepare the solar battery panel 60 according to the present invention.

Figure 7:
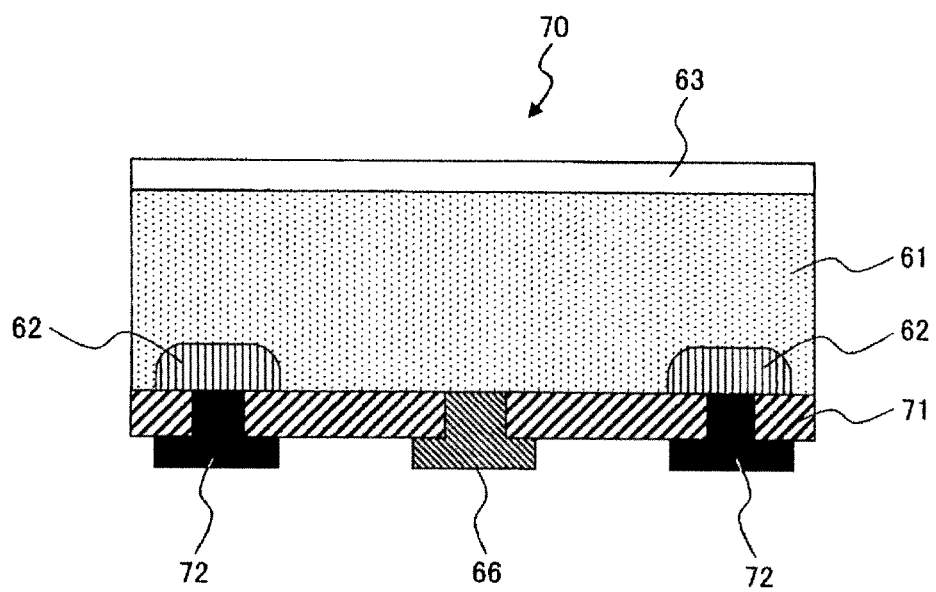
FIG. 7 is a schematic view showing an example of the cross-sectional surface of a rear surface electrode-type solar battery panel.

Furthermore, a rear surface electrode-type (back-contact type) solar battery panel comprising the above-mentioned light-receiving surface electrode/wiring 64 disposed on the rear surface was separately prepared. FIG. 7 is a schematic view showing an example of the cross-sectional surface of the rear surface electrode-type solar battery panel. The rear surface electrode-type solar battery panel 70 was prepared by firstly preparing a semiconductor substrate 61 comprising a diffusion layer 62 and a passivation film 71 formed on the rear surface of the semiconductor substrate and an antireflective film 63 formed on the light-receiving surface. Thereafter, an electroconductive glass paste were applied onto the rear surface and fired in a similar manner to that mentioned above to thereby form an electrode/wiring 72 (an electrode/wiring corresponding to the light-receiving surface electrode/wiring 64) and an output electrode/wiring 66 to thereby prepare a rear surface electrode-type solar battery panel 70.

Various tests and evaluations were conducted on the solar battery panel 60 prepared above. It was confirmed that the light-receiving surface electrode/wiring 64 and semiconductor substrate 61 were electrically connected on the light-receiving surface. It was confirmed that an ohmic contact was obtained among the semiconductor substrate 61, power collecting electrode/wiring 65 and output electrode/wiring 66 on the rear surface. The rear surface electrode-type solar battery panel 70 was similarly confirmed. Furthermore, when the power generation efficiencies of the prepared solar battery panels 60 and 70 were tested and evaluated, power generation efficiencies (18.0%) that are equivalent to or more than that of a conventional solar battery panel using a conventional electroconductive glass paste were obtained.

Furthermore, when the overlapped part of the power collecting electrode/wiring 65 and output electrode/wiring 66 formed on the rear surface was investigated, an alloy phase had not been formed. The reason therefor was considered that the solar battery panel according to the present invention had a firing temperature (350° C.), which is significantly lower than conventional ones (500 to 800° C.), and thus an alloy phase was not formed. As a result, a problem of generation of cracks on the semiconductor substrate 61 by the formation of an alloy phase is resolved.

Although quartz crystal units and solar battery panels are explained as typical examples of the electrical/electronic components according to the present invention in the above-mentioned Examples, it is obvious that the present invention is not limited to those and can be applied to various electrical/electronic components such as image display devices, handheld terminals, IC packages, laminated capacitors, LEDs, multilayer circuit substrates and the like.

REFERENCE SIGNS LIST

31 glass composition powder
32 metal particles
33 resin binder
34 airspace
35 melted glass (liquid phase)
36 neck
51 substrate
52 wiring
53 electroconductive glass paste
54 quartz crystal unit
55 glass paste for sealing
56 cap
60 solar battery panel
61 semiconductor substrate
62 diffusion layer
63 antireflective layer
64 light-receiving surface electrode/wiring
65 power collecting electrode/wiring
66 output electrode/wiring
70 rear surface electrode-type solar battery panel
71 passivation film
72 electrode/wiring

The invention claimed is:

1. A lead-free glass composition, comprising
    10 to 60 mass % of $Ag_2O$, 5 to 65 mass % of $V_2O_5$, and 15 to 50 mass % of $TeO_2$ when the components are represented by oxides,
    wherein the total content ratio of $Ag_2O$, $V_2O_5$ and $TeO_2$ is 75 mass % or more and less than 100 mass %, and
    further comprising one or more selected from the group consisting of $P_2O_5$, BaO, $K_2O$, $WO_3$, $Fe_2O_3$, $MnO_2$, $Sb_2O_3$ and ZnO as a remnant by more than 0 mass % and 25 mass % or less,
    wherein (content ratio of $Ag_2O$)/(content ratio of $V_2O_5$) is 2.6 or less.

2. The glass composition according to claim 1, wherein the sum of the content ratio of $Ag_2O$ and the content ratio of $V_2O_5$ is 40 to 80 mass %.

3. A glass frit for sealing, comprising 50 to 100 vol % of the glass composition according to claim 1, and comprising more than 0 and less than or equal to 50 vol % of an oxide filler material other than the oxides that constitute the glass composition.

4. The glass frit for sealing according to claim 3, wherein the oxide filler material is one or more selected from the group consisting of $SiO_2$, $ZrO_2$, $Al_2O_3$, $Nb_2O_5$, $ZrSiO_4$, $Zr_2(WO_4)(PO_4)_2$, cordierite, mullite and eucryptite.

5. A glass paste for sealing, comprising the glass composition according to claim 1, an oxide filler material other than the oxides that constitute the glass composition, and a solvent.

6. The glass paste for sealing according to claim 5, wherein
    the oxide filler material is one or more selected from the group consisting of $SiO_2$, $ZrO_2$, $Al_2O_3$, $Nb_2O_5$, $ZrSiO_4$, $Zr_2(WO_4)(PO_4)_2$, cordierite, mullite and eucryptite,
    the solvent is butylcarbitol acetate or α-terpineol, and
    the glass paste for sealing further comprises nitrocellulose as a resin binder.

7. An electroconductive glass paste, comprising the glass composition according to claim 1, metal particles, an oxide filler material other than the oxides that constitute the glass composition, and a solvent.

8. The electroconductive glass paste according to claim 7, wherein
    the metal particles are silver, a silver alloy, aluminum, an aluminum alloy, copper or a copper alloy,
    the oxide filler material is one or more selected from the group consisting of $SiO_2$, $ZrO_2$, $Al_2O_3$, $Nb_2O_5$, $ZrSiO_4$, $Zr_2(WO_4)(PO_4)_2$, cordierite, mullite and eucryptite,
    the solvent is butylcarbitol acetate or α-terpineol, and the electroconductive glass paste further comprises nitrocellulose as a resin binder.

9. The electroconductive glass paste according to claim 7, wherein the metal particles have an average particle size of 0.5 to 10 μm, and have a spherical shape and/or a flaky shape.

10. The electroconductive glass paste according to claim 7, wherein the metal particles are a mixture of a group of particles having an average particle size of 0.5 to 3 μm and a group of particles having an average particle size of 5 to 10 μM.

11. An electrical component having a sealing unit comprising a lead-free glass phase, wherein
the sealing unit comprises 50 to 100 vol % of the glass phase, and
the glass phase comprises 10 to 60 mass % of $Ag_2O$, 5 to 65 mass % of $V_2O_5$ and 15 to 50 mass % of $TeO_2$ when the components are represented by oxides,
wherein the total content ratio of $Ag_2O$, $V_2O_5$ and $TeO_2$ is 75 mass % or more and less than 100 mass %,
the glass phase further comprises one or more selected from the group consisting of $P_2O_5$, BaO, $K_2O$, $WO_3$, $Fe_2O_3$, $MnO_2$, $Sb_2O_3$ and ZnO as a remnant by more than 0 mass % and 25 mass % or less, and
wherein (content ratio of $Ag_2O$)/(content ratio of $V_2O_5$) is 2.6 or less.

12. An electrical component having an electrode or wiring comprising a lead-free glass phase and metal particles, wherein
the electrode or wiring comprises 5 to 30 vol % of the glass phase and 70 to 95 vol % of the metal particles,
the metal particles are silver, a silver alloy, aluminum, an aluminum alloy, copper or a copper alloy, and
the glass phase comprises 10 to 60 mass % of $Ag_2O$, 5 to 65 mass % of $V_2O_5$ and 15 to 50 mass % of $TeO_2$ when the components are represented by oxides,
wherein the total content ratio of $Ag_2O$, $V_2O_5$ and $TeO_2$ is 75 mass % or more and less than 100 mass %, and
the glass phase further comprises one or more selected from the group consisting of $P_2O_5$, BaO, $K_2O$, $WO_3$, $Fe_2O_3$, $MnO_2$, $Sb_2O_3$ and ZnO as a remnant by more than 0 mass % and 25 mass % or less, and
wherein (content ratio of $Ag_2O$)/(content ratio of $V_2O_5$) is 2.6 or less.

13. The electrical component according to claim 12, wherein the electrode/wiring has an electrical resistance rate of lower than $10^{-5}$ Ωcm.

14. The electrical component according to claim 13, wherein the sum of the content ratio of $Ag_2O$ and the content ratio of $V_2O_5$ is 40 to 80 mass %.

\* \* \* \* \*